US012716714B2

(12) United States Patent
Shiode

(10) Patent No.: US 12,716,714 B2
(45) Date of Patent: Aug. 25, 2026

(54) MEASUREMENT METHOD, SHAPING DEVICE, SIMULATOR, MEASUREMENT DEVICE, AND STORAGE MEDIUM

(71) Applicant: CANON KABUSHIKI KAISHA, Tokyo (JP)

(72) Inventor: Yoshihiro Shiode, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 289 days.

(21) Appl. No.: 18/423,426

(22) Filed: Jan. 26, 2024

(65) Prior Publication Data

US 2024/0262021 A1 Aug. 8, 2024

(30) Foreign Application Priority Data

Feb. 7, 2023 (JP) ................................ 2023-016898

(51) Int. Cl.

| | |
|---|---|
| ***G01B 11/24*** | (2006.01) |
| ***G01N 21/45*** | (2006.01) |
| ***G03F 7/00*** | (2006.01) |
| *B29C 43/58* | (2006.01) |

(52) U.S. Cl.

CPC ......... *G01B 11/2441* (2013.01); *G01N 21/45* (2013.01); *G03F 7/0002* (2013.01); *B29C 43/58* (2013.01); *B29C 2043/5891* (2013.01)

(58) Field of Classification Search

CPC .. G03F 7/0002; G01N 21/45; G01N 21/9501; G01B 11/2441; B29C 2043/5891; B29C 43/003

See application file for complete search history.

(56) References Cited

U.S. PATENT DOCUMENTS

2009/0140445 A1 6/2009 Lu et al.
2018/0364565 A1* 12/2018 Baba ...................... B29C 59/02
2021/0187795 A1* 6/2021 Tavakkoli Kermani Ghariehali ........ H01L 21/31138
2022/0111634 A1* 4/2022 Ito ........................ B41J 2/14201

FOREIGN PATENT DOCUMENTS

JP 5433584 B2 3/2014
KR 1020150143321 A 12/2015
KR 1020170133501 A 12/2017
KR 1020180136903 A 12/2018
KR 20220014298 A * 2/2022 ............ G01N 21/45
KR 1020220160487 A 12/2022
KR 20230124482 A * 8/2023 .......... G03F 7/0002

* cited by examiner

*Primary Examiner* — Maurice C Smith
(74) *Attorney, Agent, or Firm* — ROSSI, KIMMS & McDOWELL LLP

(57) ABSTRACT

A measurement method of measuring deflection of a mold by measuring Newton's rings obtained by pressing the mold on a substrate with a resist interposed therebetween and irradiating the substrate with light via the mold includes: performing the pressing through the resist having a height less than an optical distance $\lambda/4$, $\lambda$ being a wavelength of the light; measuring peak positions of the Newton's rings in a contact boundary portion between the mold and the substrate in a region in which a gap between the mold and the substrate is less than the optical distance $\lambda/4$; and calculating the deflection of the mold based on the peak positions.

14 Claims, 23 Drawing Sheets

Figure 18:
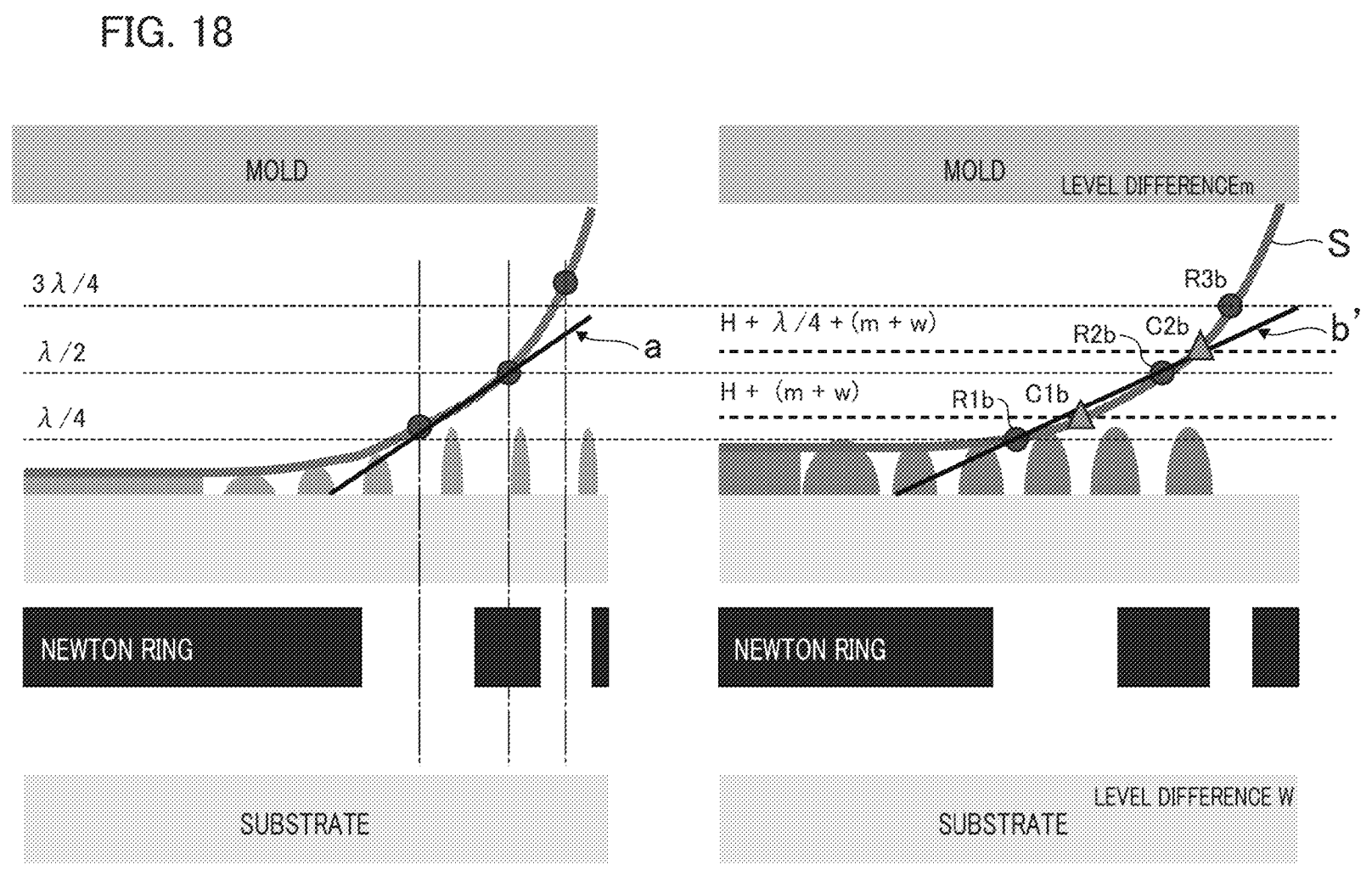

MOLD
LEVEL DIFFERENCEm
S
b'
R3b
C2b
R2b
C1b
R1b
$H + \lambda/4 + (m + w)$
$H + (m + w)$
NEWTON RING
SUBSTRATE
LEVEL DIFFERENCE W MOLD
a
$3\lambda/4$
$\lambda/2$
$\lambda/4$
NEWTON RING
SUBSTRATE

MEASUREMENT METHOD, SHAPING DEVICE, SIMULATOR, MEASUREMENT DEVICE, AND STORAGE MEDIUM

BACKGROUND OF THE INVENTION

Field of the Invention

The present invention relates to a measurement method, a shaping device, a simulator, a measurement device, and a storage medium for measuring Newton's rings.

Description of the Related Art

In general, in a shaping device such as an imprint device, a pattern of an imprint material is formed on a substrate by curing the imprint material in a state in which the imprint material on the substrate and a mold are in contact with each other and releasing the mold from the cured imprint material.

When the imprint material on the substrate and the mold are brought into contact with each other, (a pattern surface of) the mold is deformed (deflected) to be convex toward the substrate and then the mold is returned to its original shape (a planar shape). Accordingly, gas present between the substrate (the imprint material on the substrate) and the mold is extruded to the outside and bubbles mixed into the imprint material on the substrate are decreased.

As a method of optimizing imprint conditions, for example, a speed of a line which is called a contact boundary between the mold and the substrate with a resist on which imprinting is in progress therebetween is observed and controlled in Japanese Patent No. 5433584. However, there is a need to measure information on the contact boundary with higher accuracy.

SUMMARY OF THE INVENTION

According to an aspect of the present invention, there is provided a measurement method of measuring deflection of a mold by measuring Newton's rings obtained by pressing the mold on a substrate with a resist interposed therebetween and irradiating the substrate with light via the mold, the measurement method including: performing the pressing through the resist having a height less than an optical distance $\lambda/4$, $\lambda$ being a wavelength of the light; measuring peak positions of the Newton's rings in a contact boundary portion between the mold and the substrate in a region in which a gap between the mold and the substrate is less than the optical distance $\lambda/4$; and calculating the deflection of the mold based on the peak positions.

Further features of the present invention will become apparent from the following description of embodiments with reference to the attached drawings.

BRIEF DESCRIPTION OF THE DRAWINGS

FIG. 18 is a conceptual diagram illustrating parallel arrangement of the example illustrated in FIG. 10 and the example illustrated in FIG. 11, with the right part illustrating a case in which patterns with a level difference m and a level difference W are provided in the mold and the substrate.

DESCRIPTION OF THE EMBODIMENTS

Hereinafter, with reference to the accompanying drawings, favorable modes of the present invention will be described using Embodiments. In each diagram, the same reference signs are applied to the same members or elements, and duplicate description will be omitted or simplified.

First Embodiment

The present invention will be described below with reference to an example in which nano-imprinting is performed using an imprint device. A structure of the imprint device, process materials, an imprinting flow, problems of the imprint device in association with fillability, and the like will be described first. In a first embodiment, an imprint device is exemplified as a shaping device, and the shaping device may include, for example, a planarization device as long as it can press a mold onto a substrate with a resist interposed therebetween.

Figure 1:
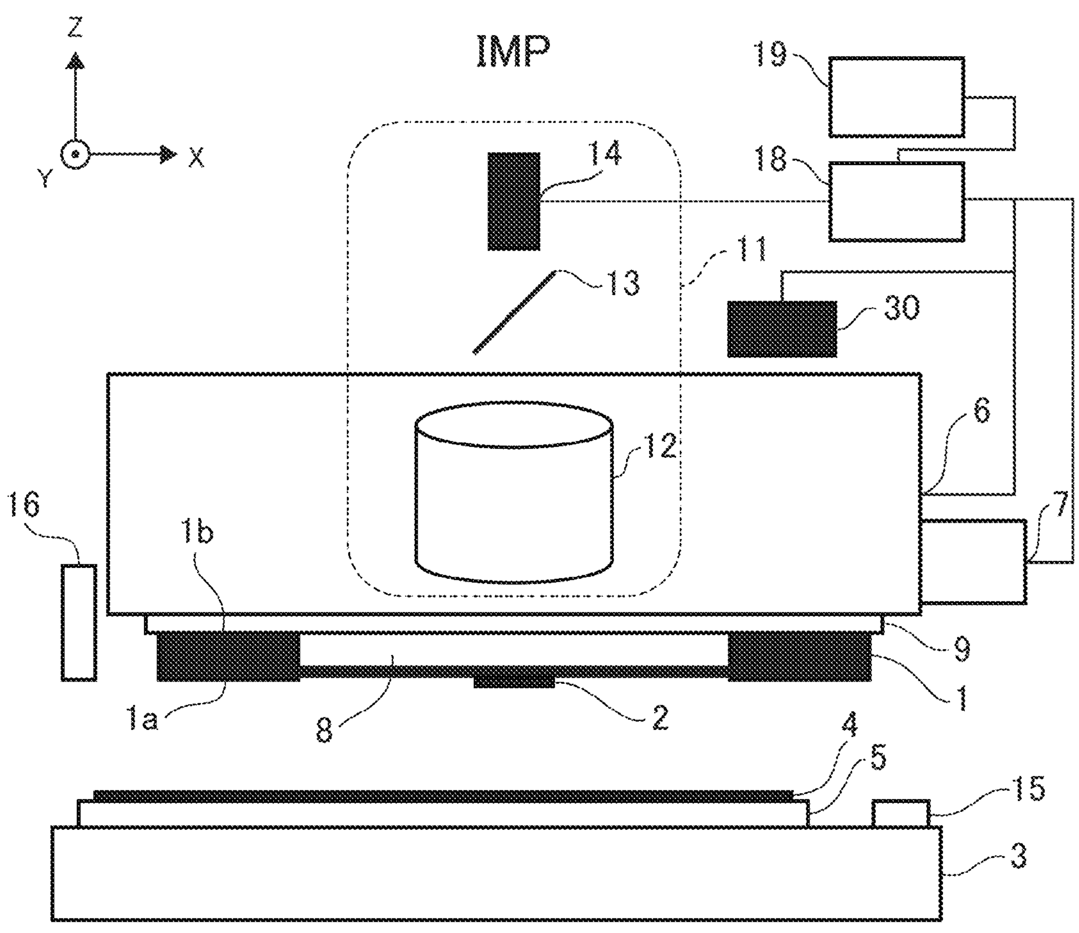
FIG. 1 is a diagram schematically illustrating a configuration of an imprint device according to a first embodiment of the present invention.

FIG. 1 is a diagram schematically illustrating a configuration of the imprint device according to the first embodiment of the present invention. The imprint device IMP is employed for a lithography process which is a manufacturing process of a semiconductor device, a magnetic storage medium, a liquid crystal display device, or the like and serves as lithography equipment for forming a pattern on a substrate.

The imprint device IMP serves as a shaping device that performs a shaping process of shaping an imprint material which is a composition on a substrate using a mold. In the first embodiment, the imprint device IMP forms a pattern of a cured material to which a pattern of a mold is transferred by bringing the mold into contact with an imprint material supplied onto a substrate and applying curing energy to the imprint material. The mold is also called a die, a template, or an original plate.

A material that is cured with application of curing energy thereto (a curable composition) is used as the imprint material. Electromagnetic waves, heat, or the like is used as the curing energy. The electromagnetic waves include, for example, light which is selected from a wavelength range of from 10 nm to 1 mm, specifically, infrared light, visible light, or ultraviolet light.

The curable composition is a composition that is cured with irradiation with light or by heating. A photo-curable composition that is cured by irradiation with light contains at least a polymerizable compound and a photopolymerization initiator and may further contain a non-polymerizable compound or a solvent according to necessity. The non-polymerizable compound is at least one selected from the group consisting of a sensitizer, a hydrogen donor, an internally added mold releasing agent, a surfactant, an antioxidant, and polymer components.

The imprint material may be applied in the form of a film onto substrate by a spin coater or a slit coater. The imprint material may be applied in the form of a droplet or an island or film form in which a plurality of droplets are connected onto a substrate by a liquid spray head. The viscosity of the imprint material (viscosity at 25° C.) is, for example, equal to or greater than 1 mPa·s and equal to or less than 100 mPa·s.

Glass, a ceramic, a metal, a semiconductor, a resin, or the like is used for the substrate, and a member formed of a material different from the substrate may be formed on the surface thereof. Specifically, the substrate includes a silicon wafer, a compound semiconductor wafer, or quartz glass.

The imprint device IMP includes a substrate stage 3, a substrate chuck 5, an imprint head 6, a pressure adjusting unit 7, and a mold chuck 9 as illustrated in FIG. 1. The imprint device IMP includes a relay optical system 12, a band-pass filter 13, an observation unit 14, a first measurement unit 15, a second measurement unit 16, a control unit 18, a storage unit 19, and an irradiation system 30. The band-pass filter 13 is constituted, for example, by a half mirror.

In the first embodiment, directions are expressed in an XYZ coordinate system in which a plane parallel to the surface of the substrate 4 is defined as an XY plane and a direction perpendicular to the XY plane is defined as a Z axis. Directions parallel to the X axis, the Y axis, and the Z axis in the XYZ coordinate system are defined as an X direction, a Y direction, and a Z direction, and rotation around the X axis, rotation around the Y axis, and rotation around the Z axis are defined as θX, θY, and θZ.

Control or drive (movement) associated with the X axis, the Y axis, and the Z axis means control or drive (movement) associated with a direction parallel to the X axis, a direction parallel to the Y axis, and a direction parallel to the Z axis. Control or drive associated with the θX axis, the θY axis, and the θZ axis means control or drive associated with rotation around an axis parallel to the X axis, rotation around an axis parallel to the Y axis, and rotation around an axis parallel to the Z axis.

The mold 1 has a rectangular appearance and is formed as a quartz substrate. The mold 1 includes a mesa region 2 with a pattern (a protruded/recessed pattern) to be transferred to (the imprint material on) the substrate 4 in a central part of a first surface 1*a* facing the substrate.

The mesa region 2 is formed higher than peripheral regions thereof, that is, a stepped structure is provided, to prevent the regions other than the mesa region 2 from coming into contact with the substrate 4 when a pattern is formed in the imprint material on the substrate.

The mold 1 includes a core-out 8 (a recessed structure) which is a cylindrical recess in a second surface 1*b* opposite to a first surface 1*a* including the mesa region 2. The core-out 8 is also called a cavity and is generally formed such that the center of the core-out 8 overlaps the center of the mesa region 2.

The imprint head 6 holds the mold 1, for example, using the mold chuck 9 that chucks the mold 1 in a vacuum or in an electrostatic manner. The imprint head 6 is movable in the Z direction and serves as a pressing unit that brings the mold 1 held by the mold chuck 9 into contact with the imprint material on the substrate and presses the mold.

Figure 2:
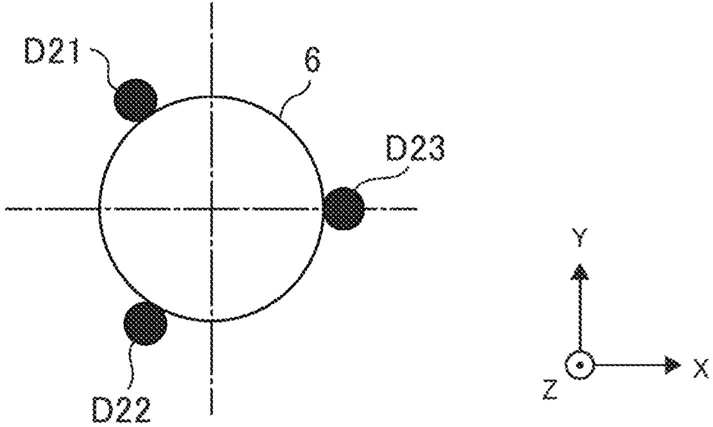
FIG. 2 is a diagram illustrating an example of a configuration of a drive unit of an imprint head 6.

The imprint head 6 includes a drive unit configured to drive (move) the mold chuck 9. This drive unit includes drive systems D21, D22, and D23 of three axes as illustrated in FIG. 2. FIG. 2 is a diagram illustrating an example of a configuration of the drive unit of the imprint head 6.

The drive systems D21, D22, and D23 include, for example, an actuator that can be independently driven in the Z direction. A position or posture (status) of the imprint head 6 can be measured (observed) in real time by various sensors provided in the imprint device IMP, for example, a height sensor and a force sensor (not illustrated) built in the imprint head 6.

The pressure adjusting unit 7 adjusts a pressure of the core-out 8 provided in the mold 1. The core-out 8 deforms the mesa region 2 to be convex toward the substrate when the mold 1 is brought into contact with the imprint material on the substrate and gradually widens a contact area with the imprint material from the center of the mesa region 2. Accordingly, gas present between the mold 1 (the mesa region 2) and the substrate 4 (the imprint material) is pressed outward (to the outer periphery), and bubbles mixed into the imprint material on the substrate are decreased.

Figure 3:
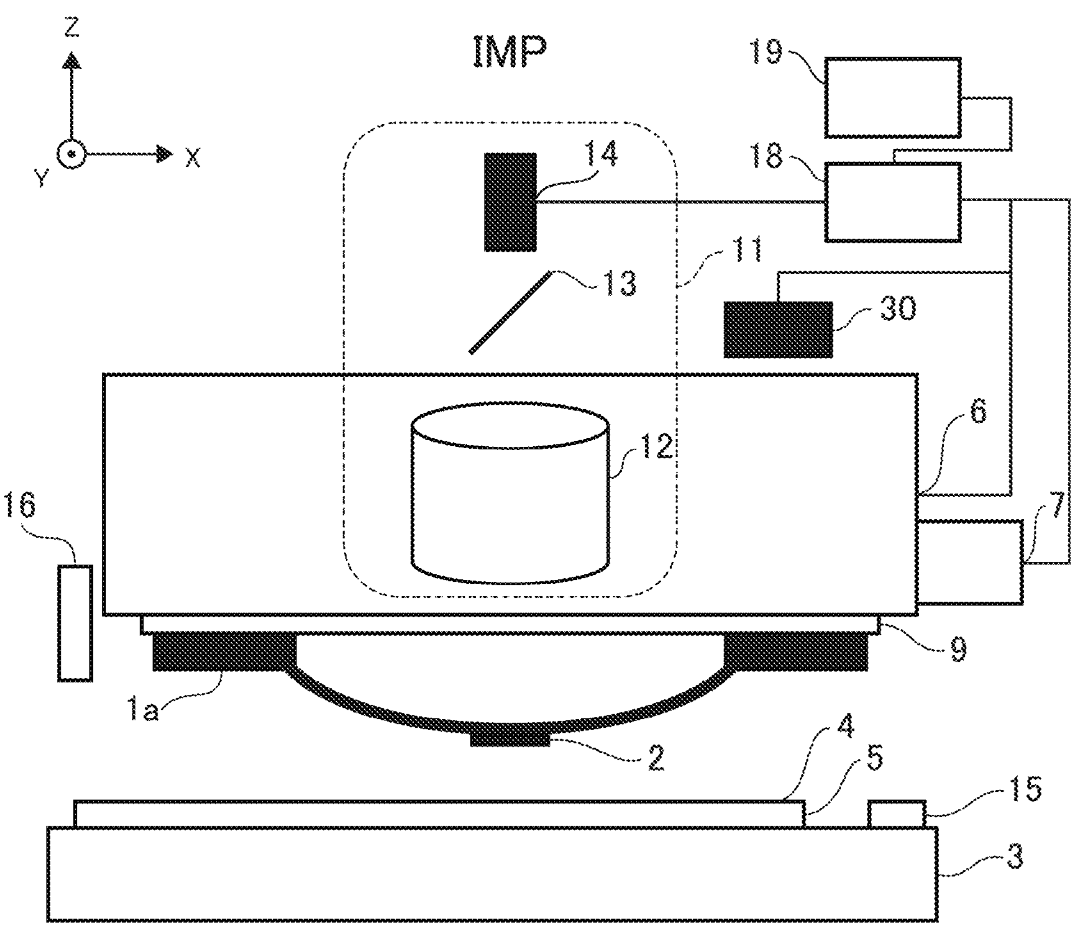
FIG. 3 is a diagram illustrating a state in which a mesa region 2 of a mold 1 is deformed to be convex toward a substrate in the imprint device according to the first embodiment.

Specifically, the pressure adjusting unit 7 deforms the mesa region 2 of the mold 1 to be convex toward the substrate as illustrated in FIG. 3 by setting the pressure of the core-out 8 to be higher than an external pressure. FIG. 3 is a diagram illustrating a state in which the mesa region 2 of the mold 1 is deformed to be convex toward the substrate in the imprint device according to the first embodiment.

Here, the pressure adjusting unit 7 serves as a deformation unit that deforms the first surface 1*a* to be convex toward the substrate by applying a pressure to the second surface 1*b* opposite to the first surface 1*a* of the mold 1.

In the first embodiment, the relay optical system 12 is provided inside of the imprint head 6, and the band-pass filter 13 and the irradiation system 30 are provided above the imprint head 6. The irradiation system 30 irradiates the imprint material on the substrate with light (for example, ultraviolet light) via the band-pass filter 13 and the relay optical system 12 in a state in which the imprint material on the substrate is in contact with the mold 1 and thus cures the imprint material.

The observation unit 14 is provided above the imprint head 6. The observation unit 14 observes the mesa region 2 of the mold 1 or a shot region of the substrate 4 via the band-pass filter 13 and the relay optical system 12.

Specifically, the observation unit 14 observes a status in which the imprint material on the substrate is enlarged by the mold 1 or interference fringes (Newton's rings) which are formed by a narrow gap between the mold 1 and the substrate 4 and acquires an image. The observation unit 14 also serves as an acquisition unit that acquires information on enlargement of the contact area (a contact region) between the mold 1 (the mesa region 2) and the imprint material on the substrate.

The substrate stage 3 holds the substrate 4, for example, using the substrate chuck 5 that chucks the substrate 4 in a vacuum or in an electrostatic manner. The substrate stage 3 enables an imprinting process on the whole surface (all shot regions) of the substrate 4 by driving (moving) the substrate chuck 5 in the X direction and the Y direction.

The first measurement unit 15 that measures a height of the first surface 1*a* of the mold 1 facing the substrate, for example, a height of the mesa region 2, is provided in the substrate stage 3. By moving the substrate stage 3 such that the first measurement unit 15 passes below the mold 1, the first measurement unit 15 can measure a shape (a surface shape) or a tilt of the mesa region 2 of the mold 1.

The second measurement unit 16 that measures a height of the substrate 4 is provided to face the substrate stage 3 in the imprint device IMP. By moving the substrate stage 3 such that the substrate 4 passes below the second measurement unit 16, the second measurement unit 16 can measure a shape (a surface shape) or a tilt of the substrate 4.

The control unit 18 is constituted by an information processing device (a computer) including a CPU and a memory and serves as a control means configured to control the imprint device IMP as a whole in accordance with a computer program stored in the storage unit 19.

The control unit 18 controls the constituents of the imprint device IMP such that the mesa region 2 (the first surface 1*a*) of the mold 1 is brought into contact with the imprint material (the composition) on the substrate and controls a process of forming a film of the imprint material between the mesa region 2 and the substrate 4.

In the first embodiment, the process of forming a film of the imprint material is an imprinting process of forming a pattern of the imprint material in each of a plurality of shot regions on the substrate. The control unit 18 can evaluate the imprinting process by analyzing an image acquired by the observation unit 14 and reflect the evaluation results in the imprinting process.

For example, the control unit 18 acquires the measurement results (the surface shape and the tilt of the mesa region 2 of the mold 1 and the surface shape and the tilt of the substrate 4) from the first measurement unit 15 and the second measurement unit 16 and ascertains leveling states of the mold 1 and the substrate 4.

Then, the control unit 18 controls the status (position or posture) of the imprint head 6 or the status (shape) of the mold 1 using the imprint head 6 or the pressure adjusting unit 7 based on the leveling states of the mold 1 and the substrate 4.

Figure 4:
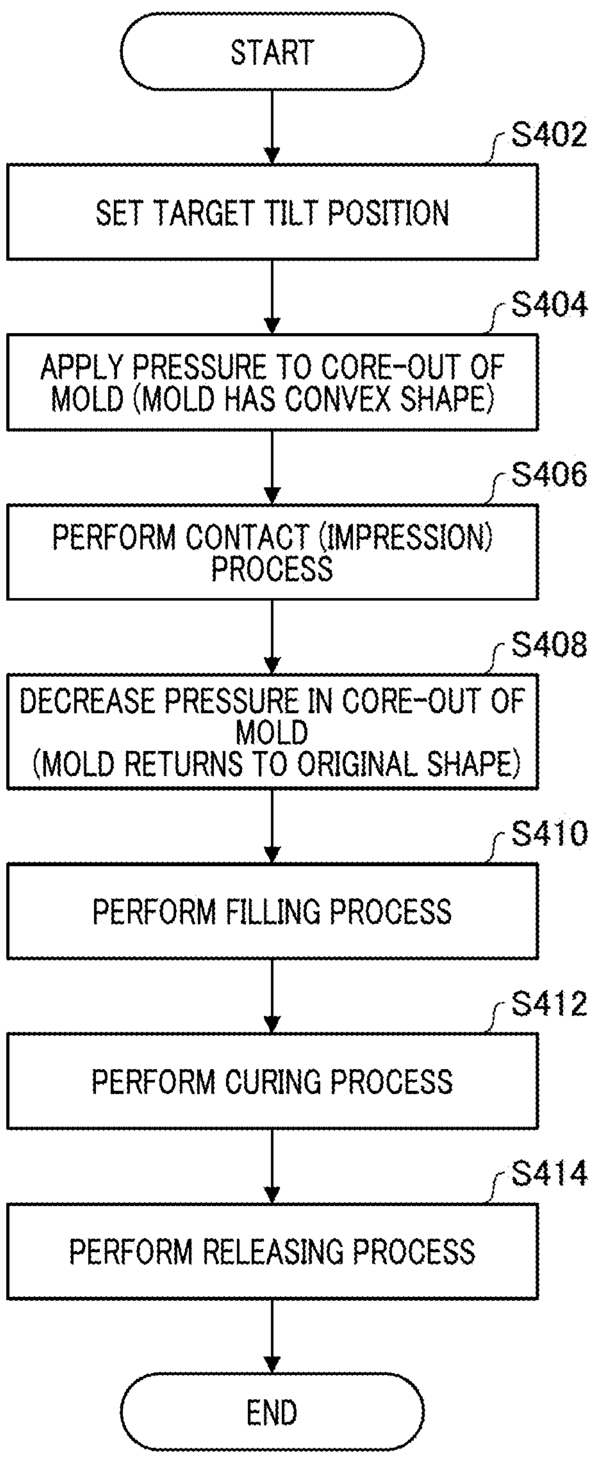
FIG. 4 is a flowchart illustrating an imprint process according to the first embodiment.

FIG. 4 is a flowchart illustrating the imprinting process according to the first embodiment. The operations of the steps in the flowchart illustrated in FIG. 4 are sequentially performed by causing the CPU or the like serving as a computer in the control unit 18 to execute a computer program stored in the memory.

In the imprinting process, an ideal imprinting process is performed by arranging the leveling states of the mesa region 2 of the mold 1 and the shot region of the substrate 4 in parallel. Therefore, the surface shape (the position in the height direction (the Z direction)) and the tilt of the mesa region 2 of the mold 1 are measured in advance by the first measurement unit 15 (on the device).

By globally measuring the surface shape and the tilt of the substrate 4 by the second measurement unit 16 at a plurality of positions on the substrate in advance, the leveling states there are acquired. In Step S402, a target tilt position (a target tilt position) of the mold 1 or the substrate 4 is set, and a gap between the mesa region 2 of the mold 1 and the substrate 4 is also set.

Subsequently, in Step S404, a pressure is added (applied) to the core-out 8 of the mold 1 using the pressure adjusting unit 7, and the mesa region 2 of the mold 1 is expanded toward the substrate to deform the mesa region in a convex shape as illustrated in FIG. 3.

This is for curbing bubbles being trapped in the imprint material on the substrate when contact between the mold 1 and the imprint material on the substrate is started as described above. A relationship between an amount of deformation of the mesa region 2 of the mold 1 and a value of the pressure applied to the core-out 8 of the mold 1 from the pressure adjusting unit 7 is measured in advance, and the pressure is set based thereon.

Then, in Step S406, a contact process of bringing the mold 1 into contact with the imprint material on the substrate is started. Specifically, the imprint head 6 moves down the mold chuck 9 holding the mold 1 in the Z direction with respect to the substrate 4 positioned in the X direction and the Y direction by the substrate stage 3 and brings the central part of the mesa region 2 of the mold 1 into contact with the imprint material on the substrate.

While this state is maintained, the mold chuck 9 is moved down in the Z direction until the pressure from the pressure adjusting unit 7 becomes a predetermined pressure, and the imprint material on the substrate is spread to the whole area of the mesa region 2 of the mold 1. At this time, height (position in the Z direction) control, tilt control, and force control of the mold 1 are performed by controlling driving of the drive systems D21, D22, and D23 constituting the drive unit of the imprint head 6.

Subsequently, when the imprint material on the substrate is spread to the whole area of the mesa region 2 of the mold 1, the pressure of the core-out 8 of the mold 1 is lowered (decreased) via the pressure adjusting unit 7 to return the shape of the mesa region 2 of the mold 1 to the original shape thereof in Step S408.

In Step S408, finally the leveling states of the mold 1 and the substrate 4 are made in parallel. Then, in Step S410, a filling process of filling the mold 1 with the imprint material on the substrate is performed, and the leveling states of the mold 1 and the substrate 4 are maintained in parallel in a predetermined period (until the mold 1 is filled with the imprint material on the substrate).

The process prior to the filling process, that is, the process including the process of Step S406 and the process of Step S408, is also referred to as a dynamic spread process.

Then, in Step S412, when the mold 1 is filled with the imprint material on the substrate, the imprint material is irradiated with light from the irradiation system 30 to cure the imprint material (a curing process). Thereafter, in Step S414, the mold chuck 9 is moved upward in the Z direction by the imprint head 6, and the mold 1 is separated from the cured imprint material on the substrate (a releasing step).

In FIG. 4, a sequence of processes of the imprinting process according to the first embodiment is illustrated, but the same sequence can also be performed in a state in which no imprint material is present on the substrate for the purpose of device calibration.

The pressure control (control for deforming the mold 1 to be convex toward the substrate), the height (position in the Z direction) control of the mold 1, the tilt control, and the force control are stored as a control profile in the storage unit 19 in advance and are performed by the control unit 18. In the imprinting process, in order to realize further improvement in productivity (throughput), there is need to shorten the time required for the dynamic spread process.

Figure 5A:
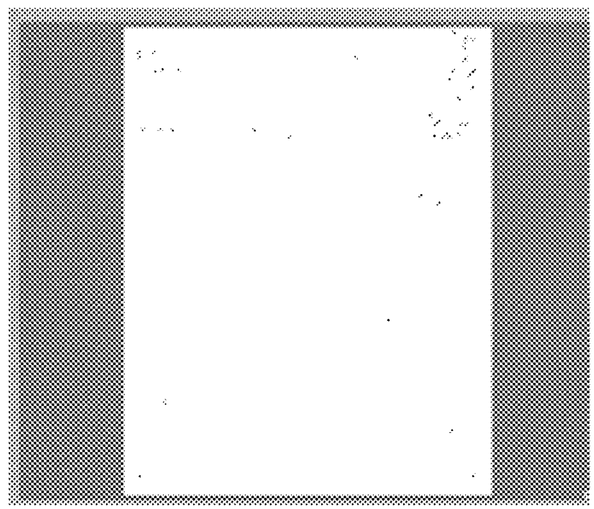
FIGS. 5A to 5C are diagrams illustrating test results obtained by observing occurrence of an unfilled defect.
Figure 5B:
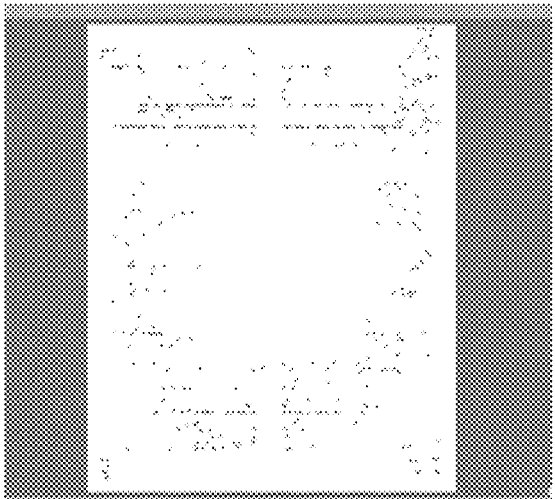
Figure 5C:
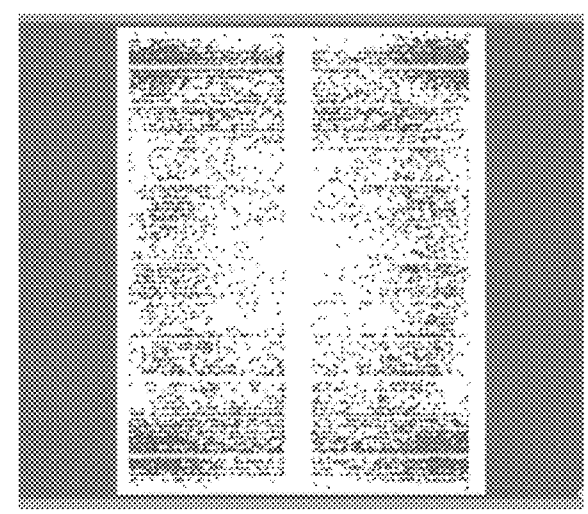

Test results obtained by observing a situation in which unfilled defects occur by changing the time required for the dynamic spread process are illustrated in FIGS. 5A to 5C. FIGS. 5A to 5C are diagrams illustrating test results obtained by observing a situation in which unfilled defects occur.

FIGS. 5A, 5B, and 5C illustrate the test results when the time required for the dynamic spread process is set to 0.6 seconds, 0.5 seconds, and 0.4 seconds. Here, the time until the filling process ends (a sum of the time required for the dynamic spread process and the time required for the filling process) are equally set to 0.8 seconds.

Here, as illustrated in FIGS. 5A to 5C, it can be seen that unfilled defects (points in the drawings) are more easily generated and the number of unfilled defects becomes larger as the time required for the dynamic spread process becomes shorter. Accordingly, when the time required for the dynamic spread process is excessively shortened, the number of unfilled defects increases, which causes a decrease in productivity.

Figures 6A, 6B, 6C:
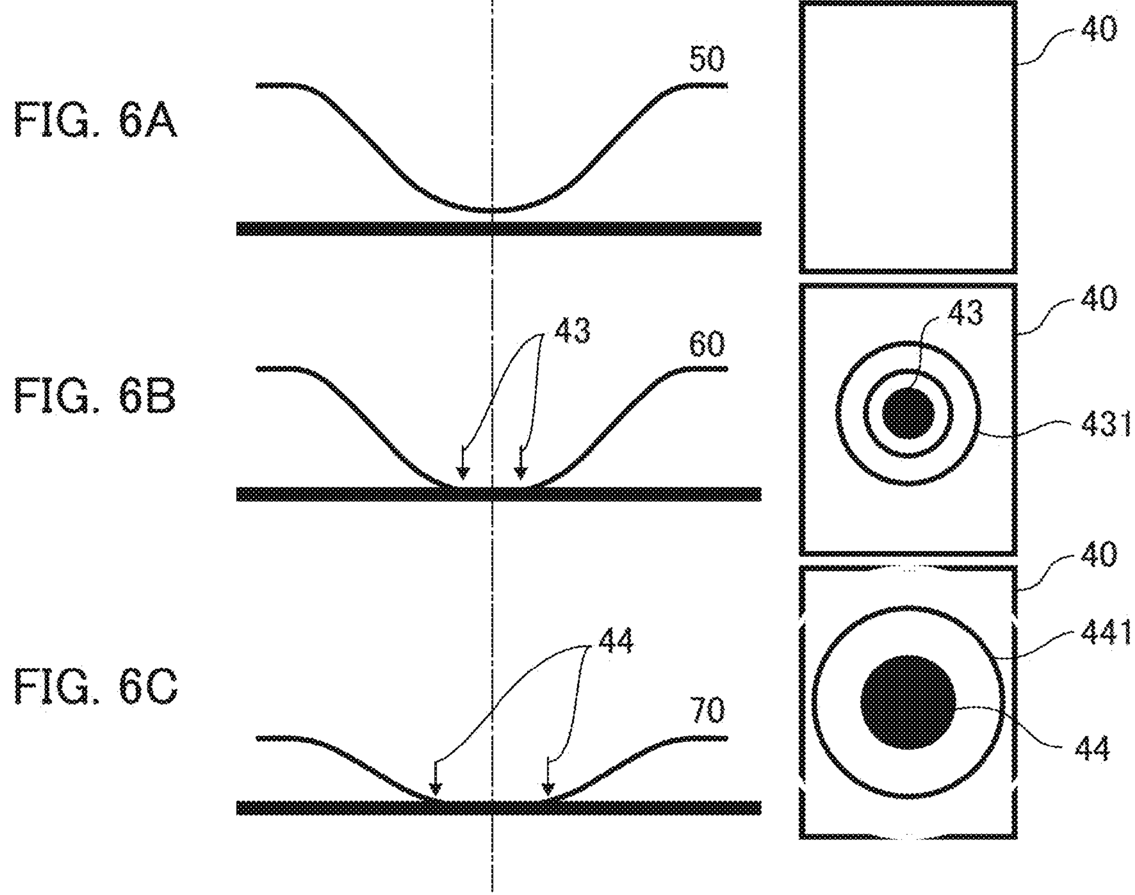
FIGS. 6A to 6C are diagrams illustrating a contact state between an imprint material on a substrate and a mold 1 (a mesa region 2) and an image 40 acquired by observation unit 14 in correspondence with such a contact state.

Test results when the time required for the dynamic spread process is changed will be considered. FIGS. 6A to 6C are diagrams illustrating contact states between the imprint material on the substrate and the mold 1 (the mesa region 2) and images 40 acquired by the observation unit 14 in correspondence with the contact states, where the contact states are different.

In FIGS. 6A to 6C, the different contact states are illustrated curved surfaces 50, 60, and 70 representing the shape (an amount of deformation) of the mold 1. FIG. 6A illustrates a state in which the imprint material on the substrate is not in contact with the mold 1, and the image 40 acquired by the observation unit 14 in this state includes no interference fringe.

FIG. 6B illustrates a state in which the imprint material on the substrate and the mold 1 are in contact with a contact radius (distance) defined by a contact boundary 43, and the image 40 acquired by the observation unit 14 in this state includes an interference pattern 431. It can be seen from the interference pattern 431 that a gap between interference fringes in the vicinity of the contact boundary 43 is narrow and thus the tilt of the convex shape (the curvature of the curved surface 60) of the mold 1 in the vicinity of the contact boundary 43 is large.

FIG. 6C illustrates a state in which the imprint material on the substrate and the mold 1 are in contact with a contact radius (distance) defined by a contact boundary 44, and the image 40 acquired by the observation unit 14 in this state includes an interference pattern 441.

In FIG. 6C, a state in which the contact boundary 43 becomes the contact boundary 44 by continuously pressing the mold 1 onto the imprint material on the substrate while keeping the pressure applied to the core-out 8 of the mold 1 constant is illustrated. It can be seen from the interference pattern 441 that a gap between interference fringes in the vicinity of the contact boundary 44 is wide and thus the tilt of the convex shape (the curvature of the curved surface 70) of the mold 1 is smaller than the tilt of the convex shape (the curvature of the curved surface 60) of the mold 1 in FIG. 6B.

Figure 7:
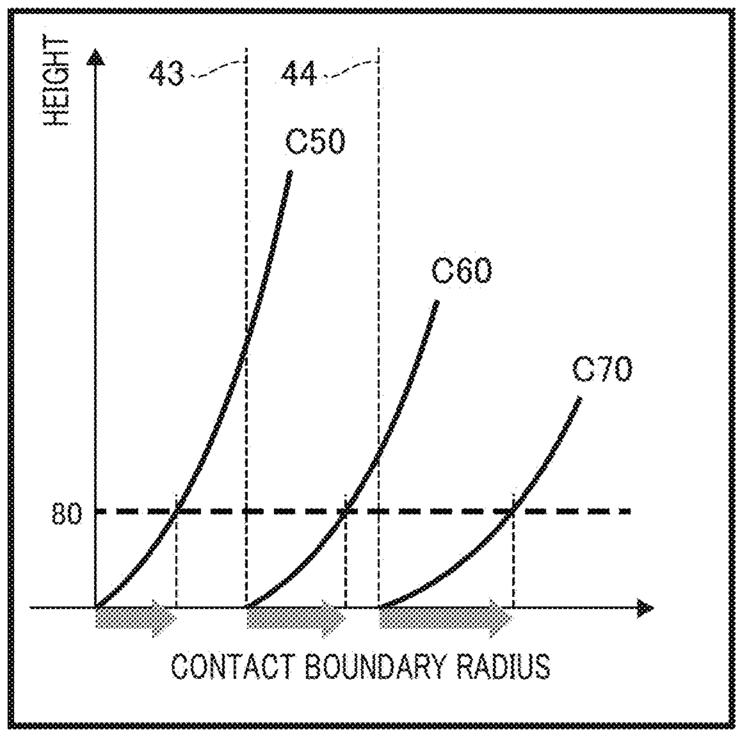
FIG. 7 is a diagram illustrating a relationship between a contact boundary radius and a mold deflection shape.

The states illustrated in FIGS. 6A to 6C will be described below in detail with reference to FIGS. 7 and 8. FIG. 7 is a diagram illustrating a relationship between a contact boundary radius and a mold deflection shape, and the shape (the curved surface 50) of the mold 1 in the state (FIG. 6A) in which the mold 1 is not in contact with the imprint material on the substrate is indicated by a height curve C50.

The shape (the curved surface 60) of the mold 1 in the state (FIG. 6B) in which the imprint material on the substrate and the mold 1 are in contact with the contact radius defined by the contact boundary 43 is indicated by a height curve C60. Similarly, the shape (the curved surface 70) of the mold 1 in the state (FIG. 6C) in which the imprint material on the substrate and the mold 1 are in contact with the contact radius defined by the contact boundary 44 is indicated by a height curve C70.

Tt can be seen from the examples of the interference patterns illustrated in FIGS. 6A to 6C that the gap between the interference fringes in the vicinity of the contact boundary increases as the contact area between the imprint material on the substrate and the mold 1 increases.

When a height at a half pitch of the interference fringes is indicated by a dotted line 80 as illustrated in FIG. 7, an increase of the gap between the interference fringes means that the contact boundary radius increases. FIG. 8 is a diagram illustrating a relationship between the contact boundary radius and the tilt of the mold. As illustrated in FIG. 8, it can be seen that the tilt of the convex shape (the curvatures of the curved surfaces 50, 60, and 70) of the mold 1 decreases as the gap between the interference fringes increases.

Figure 8:
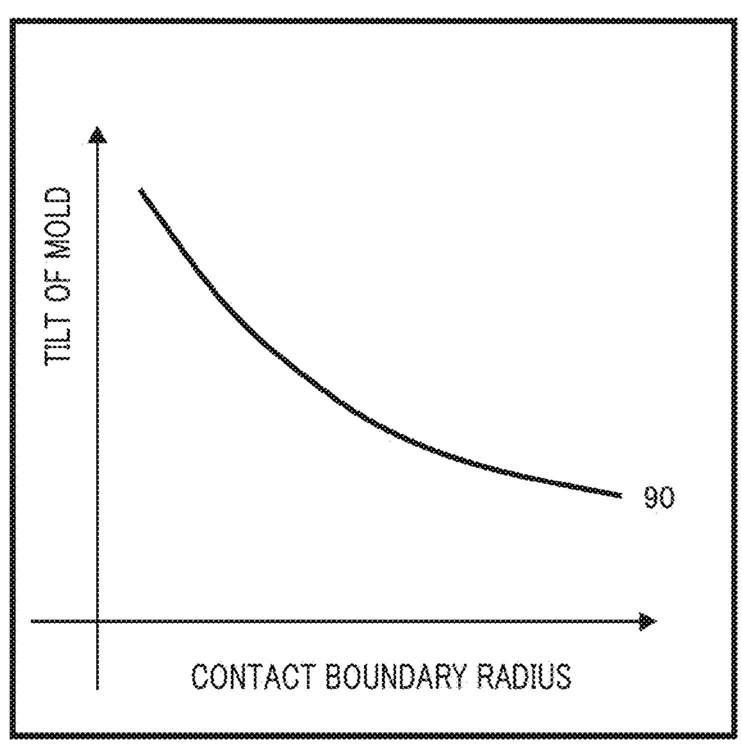
FIG. 8 is a diagram illustrating a relationship between a contact boundary radius and a tilt of a mold.

As illustrated in FIG. 8, the tilt of the convex shape of the mold 1 at the contact boundary becomes smaller in a peripheral part of a shot region in which the contact radius becomes larger. That is, in the peripheral part of the shot region, the relative tilt (curvature) between the mold 1 and the substrate 4 at the contact boundary decreases.

This means that the advantage that gas present between the mold 1 and the substrate 4 is extruded outward faster than enlargement of the imprint material by deforming the mold 1 to be convex and bubbles mixed into the imprint material on the substrate is decreased is small in the peripheral part of the shot region.

This can be understood from a distribution of unfilled defects illustrated in FIG. 5C. That is, as illustrated in FIG. 5C, the relative tilt between the mold 1 and the substrate 4 at the contact boundary decreases particularly in the peripheral part of the mesa region 2 (the shot region) and the number of unfilled defects increases therein, regardless of the time required for the dynamic spread process.

In FIG. 5C, it is also taught that this tendency becomes remarkable by shortening the time required for the dynamic spread process. This is because the pressure of gas present between the mold 1 and the substrate 4 increases and the number of gas molecules trapped between the mold 1 and the substrate 4 (the imprint material on the substrate) increases by increasing the enlargement speed of the imprint material on the substrate.

It is described above that the height curve or the curvature in the vicinity of the contact boundary contributes to filling performance. A relationship between the interference fringes (Newton's rings) indicated as IF in FIGS. 6A to 6C and the height curves or the curvatures will be described below. In the first embodiment, interference fringe information required for accurately acquiring a curvature of a mold from the relationship therebetween will be described.

Figure 9:
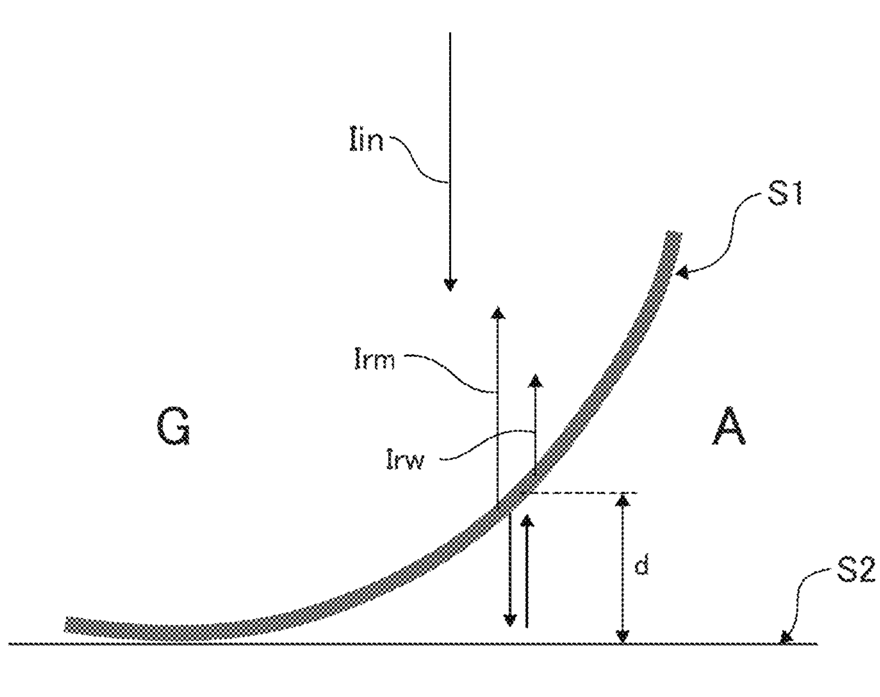
FIG. 9 is a conceptual diagram illustrating a relationship between mold deflection and an interference fringe in FIGS. 6A to 6C using a mathematical expression.

FIG. 9 is a conceptual diagram illustrating a relationship between mold deflection and interference fringes in FIGS. 6A to 6C using a mathematical expression. In FIG. 9, A denotes air, G denotes glass, W denotes a substrate, S1 denotes a boundary between the air A and the glass G, and S2 denotes a boundary between the air A and the substrate 4.

When incident light Iin is applied from above the glass G, a reflected light beam reflected by the boundary S1 is defined as Irm, and a reflected light beam transmitted by the glass G, reflected by the boundary S2 of the substrate 4, and transmitted by the boundary S1 is defined as Irw, these two reflected light beams are main light beams forming the interference fringes. Accordingly, an interference fringe intensity I can be expressed by Expression 1. Rm denotes reflectance of the glass G, Rw denotes reflectance of the substrate 4, and λ denotes a wavelength.

(Expression 1)

$$I = (Irm + Irw)^2 = 2\cos\left(\frac{2d}{\lambda}\cdot 2n\right)\cdot Rm\cdot(1-Rm)\cdot Rw + Rm^2 + \{(1-Rm)\cdot Rq\}^2$$

The first term in Expression 1 corresponds to formation of rings (Newton's rings), and peak positions of the rings of the Newton's rings (upper and lower swing curves) can be defined as Pn from the center of the Newton's rings, where n=1, 2, 3 . . . . Detection of Pn can correspond to a distance d=λ/4·n between the mold and the substrate.

Figure 10:
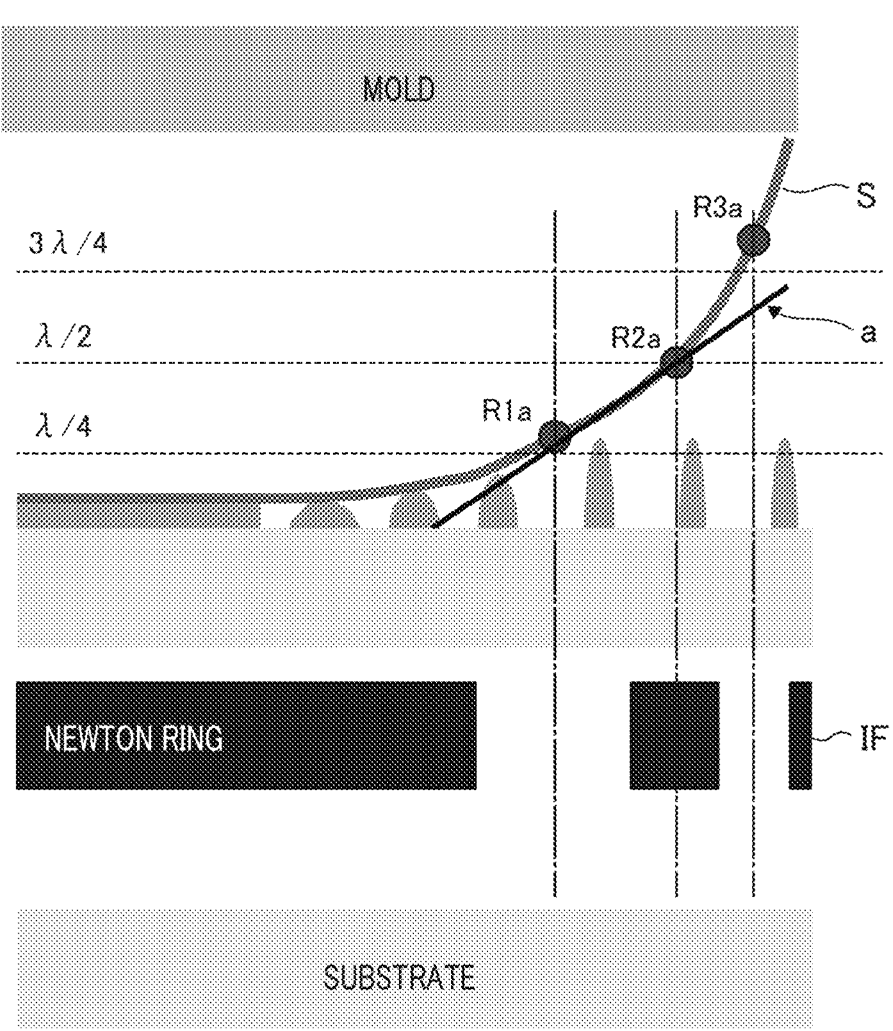
FIG. 10 is a schematic diagram conceptually illustrating a relationship between a mold deflection curve S and a Newton's fringe IF when drops applied onto a plain substrate are pressed with a plain glass mold.

The interference fringes which are formed via the resist during actual imprinting will be described below. FIG. 10 is a schematic diagram conceptually illustrating a relationship between a mold deflection curve S and a Newton's fringe IF when drops applied onto a plain substrate are pressed with a plain glass mold.

The height of a point R1*a* on the mold deflection curve S corresponding to the point P1 is λ/4. Similarly, the heights of points R2*a* and R3*a* corresponding to the points P2 and P3 are λ/2 and 3λ/4. When a slope of a straight line connecting the point R1*a* and the point R2*a* is defined as the slope equal to the mold curvature, a curvature slope a can be acquired by measuring the interference fringes on which imprinting is in progress.

In this way, in the measurement method according to the first embodiment, deflection of a mold is measured by pressing the mold onto the substrate with the resist interposed therebetween and measuring the Newton's rings obtained by irradiating the substrate with light via the mold.

Figure 11:
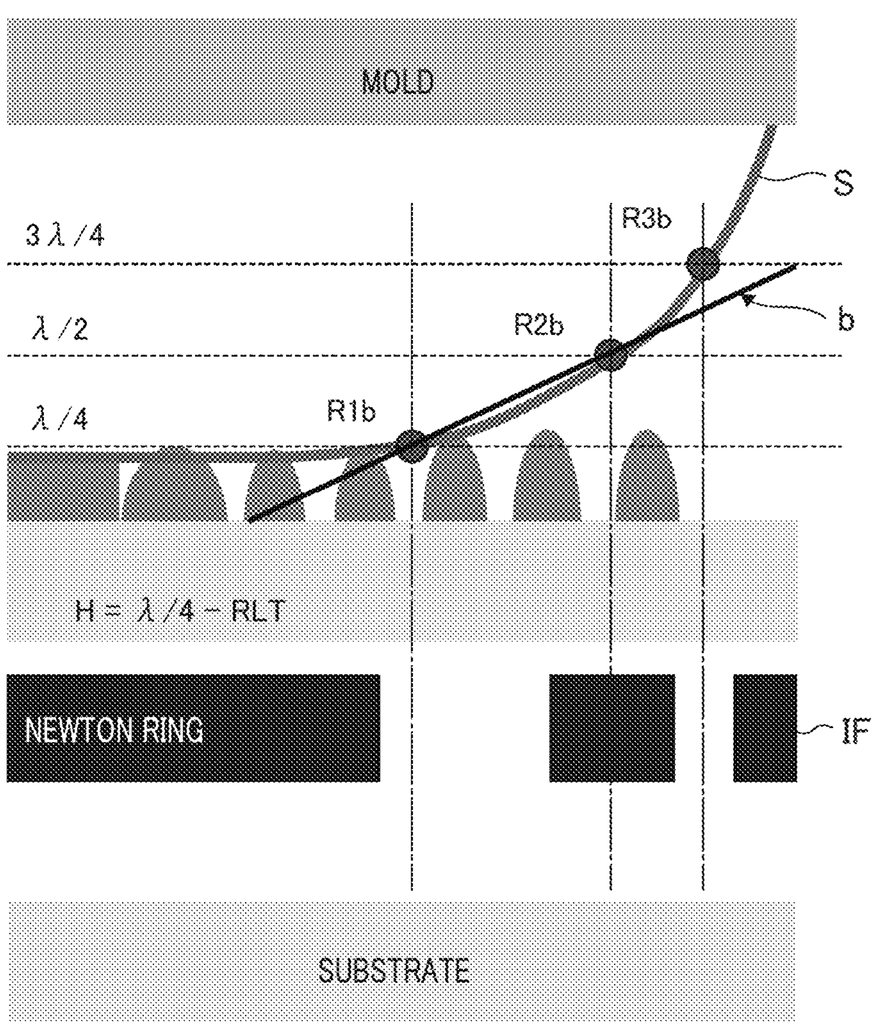
FIG. 11 is a schematic diagram conceptually illustrating a relationship between a mold deflection curve S and a Newton's fringe IF when an amount of drops is increased and an RLT is increased in comparison with those in FIG. 10.

FIG. 11 is a schematic diagram conceptually illustrating a relationship between the mold deflection curve S and the Newton's fringe IF when an amount of drops is increased and an RLT is increased in comparison with those in FIG. 10. Here, the residual layer thickness (RLT) means a thickness of the imprint material when imprinting is being performed or after imprinting has been performed.

The imprinting in the first embodiment is not limited to pressing the mold with a pattern onto the resist (the imprint material), and includes pressing a plain mold without a pattern onto the resist (the imprint material).

In FIG. 11, the height of a point R1*b* on the mold deflection curve S corresponding to the point P1 (a first ring) of the Newton's rings is λ/4, and the heights of points R2*b* and R3*b* corresponding to the points P2 and P3 are λ/2 and 3λ/4. Accordingly, a curvature slope b is acquired from the points R1*b* and R2*b*. In this way, it can be seen through comparison between FIG. 10 and FIG. 11 that the curvature slope in the case illustrated in FIG. 11 with an increased RLT is smaller.

The reason will be described below. Here, in both cases illustrated in FIGS. 10 and 11, a region (a central part of the Newton's rings) in which the mold is completely in close contact with the resist and the gap between the mold and the substrate reaches the RLT is thought to be an origin of the mold height.

In this case, for example, the height H of the point R1*a* or R1*b* from the origin is expressed by H=λ/4−RLT, and it can be seen that the height H of the point R1*b* with a large RLT is smaller. That is, the curvature slope closer to the contact boundary of the mold deflection can be said to be measured.

From the aforementioned description, a curvature in a region lower than λ/4 in the vicinity of the contact boundary of the mold can be acquired by setting the RLT to a value less than λ/4 and measuring the interference fringes. Since the change in curvature of the contact boundary determines filling performance as described above in the first embodiment, it is possible to sensitively measure the change in curvature by performing measurement at a position closer to the contact boundary. As a result, it is possible to adjust, optimize, and analyze filling performance with higher accuracy.

As described above, in the first embodiment, pressing can be performed through the resist with a height less than an optical distance λ/4, where λ is a wavelength of light. In a region in which the gap between the mold and the substrate is less than the optical distance λ/4, peak positions of the Newton's rings of the contact boundary between the mold and the substrate are measured, and deflection of the mold is calculated based on the peak positions. Accordingly, it is possible to measure deflection with high accuracy.

The height RLT is not limited to one type, but the region close to the contact boundary height λ/4 of the mold deflection curve can be measured at a plurality of points by performing imprinting and measuring at a plurality of different heights and thus it is possible to perform measuring with higher reproduction accuracy.

That is, pressing may be performed under resist conditions with a plurality of different heights less than the optical distance $\lambda/4$, and mold deflection may be measured from the peak positions of the Newton's rings. When the wavelength $\lambda$ can be decreased, the height $\lambda/4$ is also decreased and thus it is possible to measure mold deflection with higher accuracy.

Second Embodiment

In interference fringe peak detection and image processing during imprinting, substrate conditions change according to devices or processes. The thickness or film quality of a bare Si or a metallic film, particularly, an SOC film, varies according to the purpose thereof and thus optical characteristics thereof change.

Figure 12:
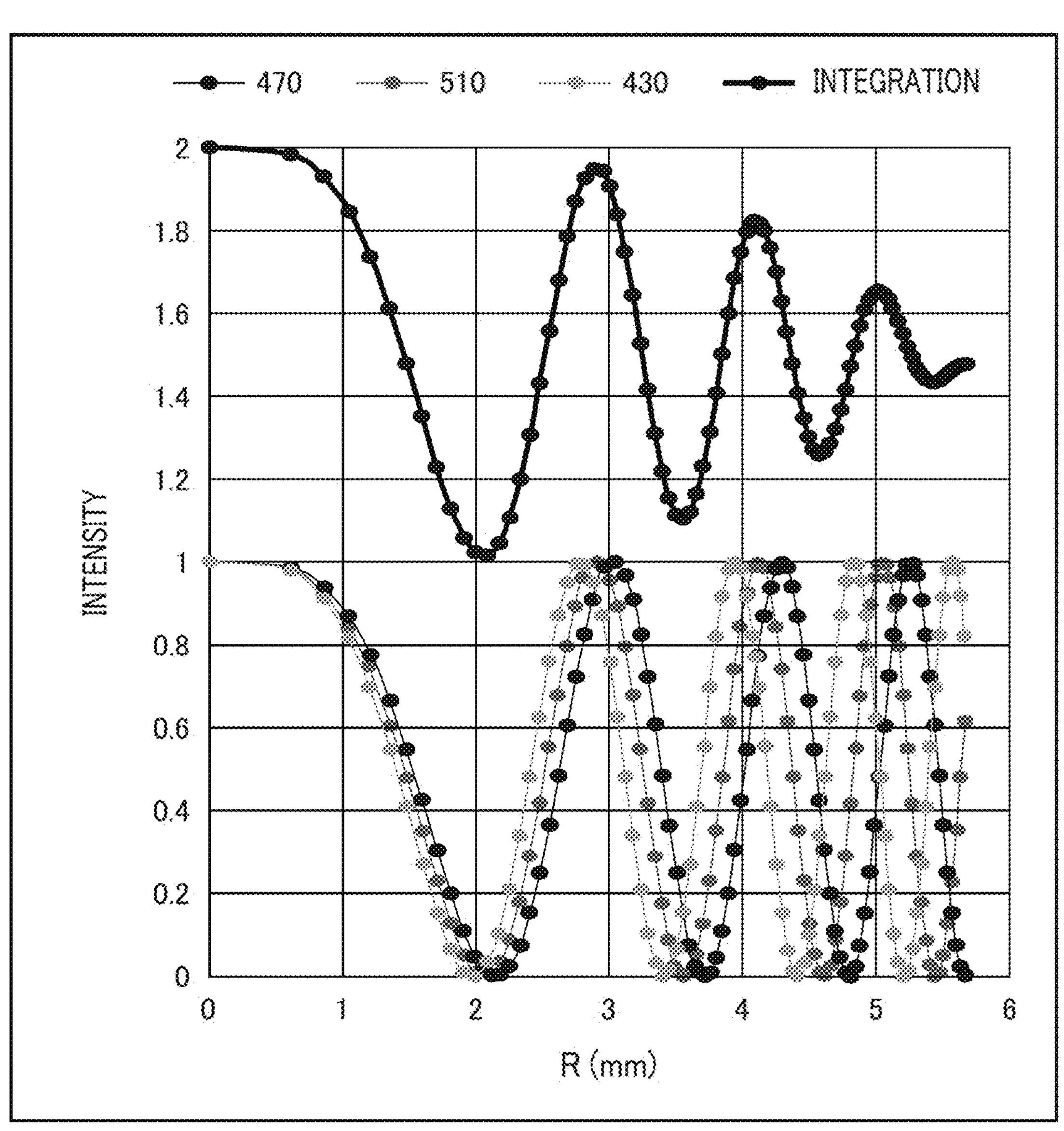
FIG. 12 is a diagram illustrating an example of interference fringes which are plotted using Expression 1 and which are formed by irradiating a substrate disposed close to glass with a predetermined curvature with parallel light beams of 3 waves.

Among the optical characteristics, a reflectance or a refractive index affects interference fringes. FIG. 12 is a diagram illustrating an example of interference fringes which are plotted using Expression 1 and which are formed by irradiating a substrate disposed close to glass with a predetermined curvature with parallel light beams of 3 waves.

The three wavelengths are 430 nm, 470 nm, and 510 nm, calculation using Expression 1 is performed for each wavelength, and integrated intensities thereof is plotted as actual interference fringes thereon. Here, for example, contrast calculated from intensities of white and black rings (upper and lower peak intensities in FIG. 12) is focused instead of absolute intensities thereof.

The three wavelengths are not light of broad wavelengths which are actually used, but are discretely integrated to simulatively calculate interference fringes. As illustrated in FIG. 12, it can be seen that the contrast of each peak deteriorates when the wavelength range is broadened.

Figure 13:
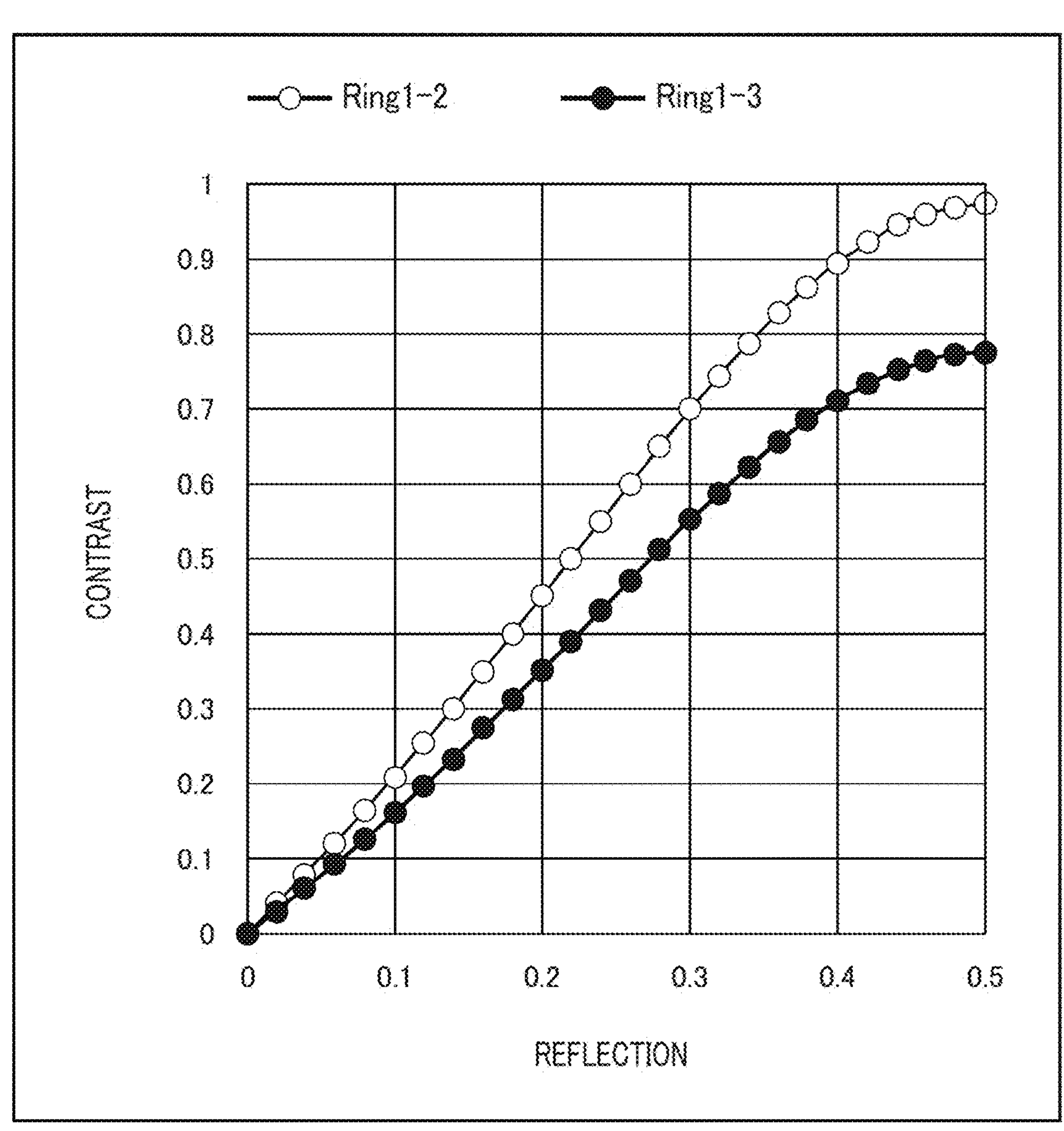
FIG. 13 is a diagram illustrating contrast of Newton's rings.

As the peak order n increases, the degree of deterioration increases. As reflectance of the substrate decrease, the degree of deterioration in contrast becomes more remarkable. FIG. 13 is a diagram illustrating contrast of Newton's rings. The difference between two curves illustrated in FIG. 13 is a difference between peaks used to calculate the contrast.

Ring1-2 is contrast which is calculated using n=2, and Ring1-3 is contrast which is calculated using n=3. It can be seen that the contrast deteriorates more when the higher order is used and the contrast deteriorates much more when reflectance of the substrate is low in any case.

Figure 14:
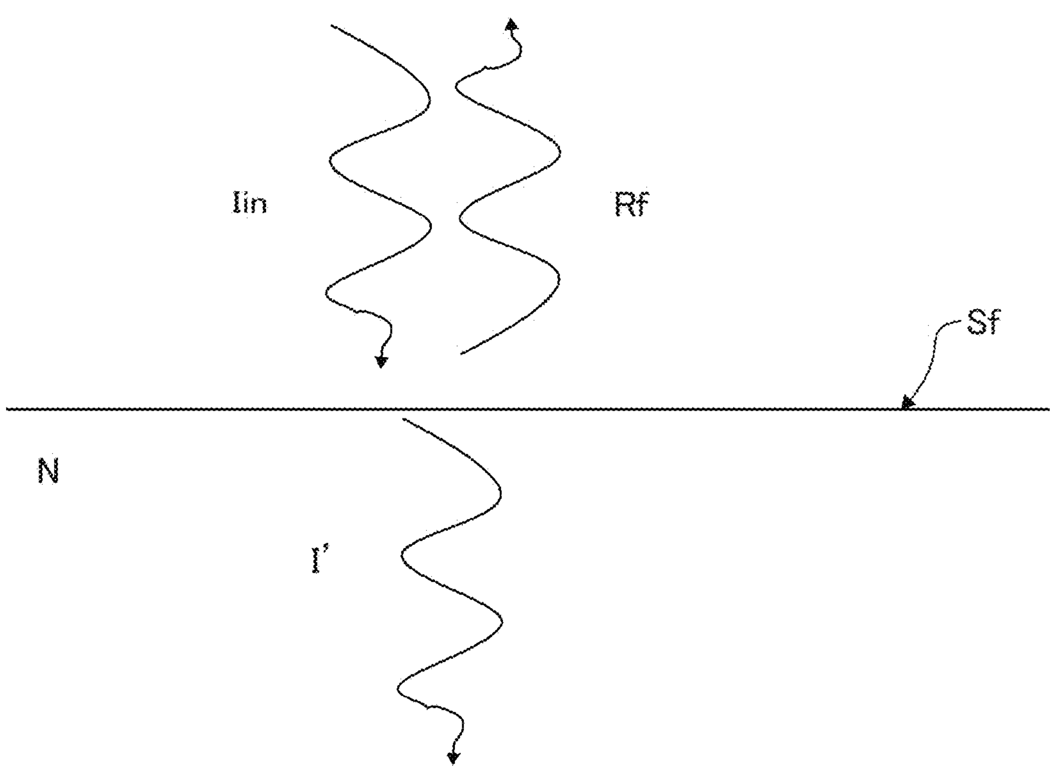
FIG. 14 is a diagram illustrating a phase shift of reflected light.

A problem with phase inversion due to the material of the substrate will be mentioned. This phenomenon can be explained on the basis of continuity of displacement occurring at a boundary at which a medium changes and the energy conservation law. FIG. 14 is a diagram illustrating a phase shift of reflected light. In FIG. 14, when an input light beam with amplitude A>0 is Iin, a light beam reflected by a boundary Sf with a relative refractive index N>0 between different media is Rf, the amplitude of the light beam Rf is B, and the amplitude of a transmitted light beam I' is C, the amplitude B and C can be expressed by Expression 2 and Expression 3.

$$B = A \times (1 - N)/(1 + N) \quad \text{(Expression 2)}$$

$$C = 2A/(1 + N) \quad \text{(Expression 3)}$$

As described in Expression 2 and Expression 3, when N<1, B>0 and C>0 are satisfied, and the phase is maintained. On the other hand, when N>1, B<0 and C>0 are satisfied, and the phase $\pi$ of a reflected light beam R0 changes. Accordingly, the interference fringes are inverted or non-inverted according to a medium on the substrate.

As described above, the appearance of Newton's rings differs according to substrate unevenness. Here, an example in which there is a difference between when a mold curvature during imprinting using a bare Si substrate is measured, device adjustment or simulator calibration is performed, and an optimal impression profile is provided and when adjustment or calibration is performed using substrates with different reflectance values through actual processes is considered.

Whether the difference is based on change of the mold curvature due to substrate unevenness (for example, change of a gas pressure due to a difference in permeability of gas) or is based on a measurement difference due to substrate unevenness may not be determined, and thus the imprinting may be performed in a non-optimal impression state.

In the first embodiment, it is assumed that there is air between the mold and the substrate, but a resist is also actually interposed in the space therebetween. That is, in measuring Newton's rings during imprinting, a drop of a resist or an applied resist is actually present between the mold and the substrate.

Depending on a contact angle between a liquid droplet and the substrate, a height of a liquid droplet of about 1 pl is normally equal to or less than 1 μm. Accordingly, depending on placement of liquid droplets, some liquid droplets are in contact with the mesa in the vicinity of the contact boundary in which the resist is pressed flat up to almost the RLT (a residual thickness of the imprint material).

Accordingly, when such a resist is present in a region subjected to image processing, a distance by which light passes through the resist, that is, an optical distance, is different from that in air. The refractive index of the resist normally ranges from 1.5 to 1.6.

When a space of Newton's rings is filled with a resist, the optical distance changes actually from 1.5 times to 1.6 times the distance $\lambda/4$, and thus the peak positions shift. That is, the peak positions shift toward a smaller gap.

Since air and liquid droplets are present in a separated state between the mold and the substrate, reflected light is generated at the boundary therebetween, and more complex interference is caused. In consideration of the phase shift of reflected light, the phase shift of reflected light at the boundary between glass and the resist is considered to be small and can be ignored because the refractive indices are close. However, in the case of the air and the resist, the phase shift differs according to a difference in order with respect to incident light, which is associated with the density of a liquid droplet.

As described above, when it is intended to accurately measure a mold tilt, particularly, P1 (a first ring), at the contact boundary under actual imprinting conditions, a peak positon error occurs. A correction means for an imprint image acquired under actual process conditions will be described below.

A difference in refractive index between materials is a difference in reflectance. The reflectance R at a boundary in refractive index between two different materials can be calculated by Expression 4.

$$R = [(n1 - n2)/(n1 + n2)]^2 \quad \text{(Expression 4)}$$

When the refractive index of the air is n1=1 and the refractive index of a bare Sin is n2=3.5, R is equal to or less than 30%. On the other hand, when the refractive index of the air is n1=1 and the refractive index of the resist is n2=1.6, R is equal to or less than 5%, and a difference in reflectance of 25% occurs. Accordingly, an ideal Newton ring intensity in a case in which there is only the air without a resist or with an ignorable resist and an actual Newton ring intensity in a case in which there is actually a resist are measured in advance.

The mold tilt is corrected on the basis of the difference in intensity by correlating the intensities at the same peak position with the mold tilt acquired through calculation including the peak.

Figure 15:
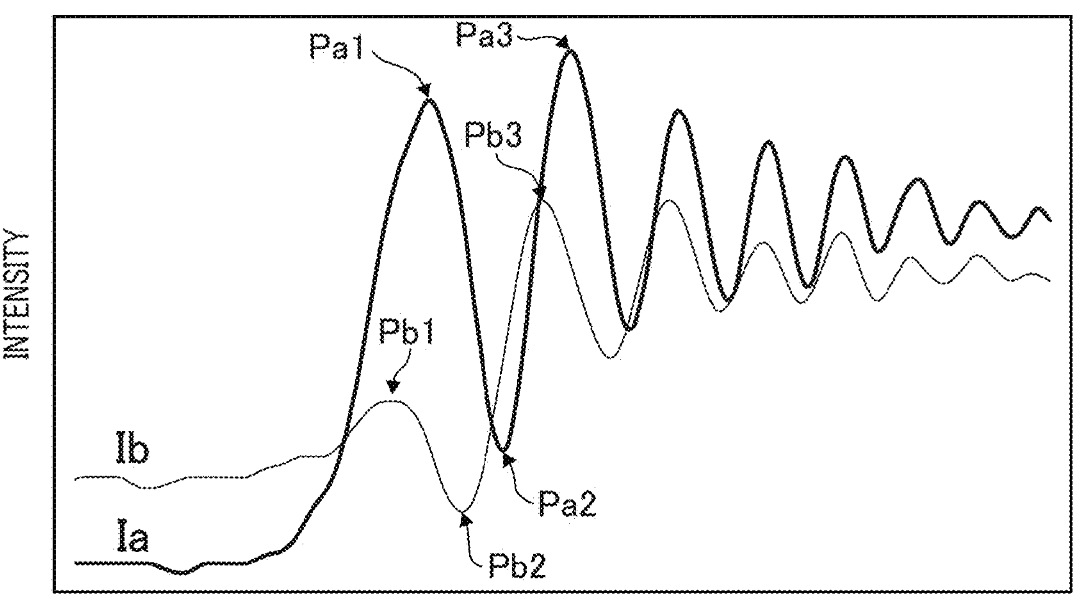
FIG. 15 is a diagram illustrating a calibration method based on two different Newton's ring signals according to a second embodiment.

FIG. 15 is a diagram illustrating a calibration method based on two different Newton ring signals according to the second embodiment. In FIG. 15, two different Newton ring signals acquired from spread images in a predetermined time when imprinting is performed using the same predetermined impression profile under a certain substrate condition and two different drop layout conditions are indicated by Ia and Ib.

Peak positions of rings of the signal 1_a_ are indicated by Pa1, Pa2, and Pa3, and peak positions of rings of the signal Ib are indicated by Pb1, Pb2, and Pb3. The tilt of mold deflection can be calculated on the basis of coordinates of the peak positions in each of Ia and Ib in the same way as in the first embodiment. The tilt may be calculated using all of three peaks or may be calculated using two peaks P1 and P2.

The calculated tilts of Ia and Ib are defined as Ka and Kb, and peak intensities thereof are defined as Ia1, Ia2, Ia3, Ib1, Ib2, and Ib3. In this case, for example, when information of Px1, Px2, and Px3 are acquired from Newton ring images under the same condition and under different imprinting conditions, a correction quantity of the tilt Kx can be calculated by Expression 5.

$$(Kb-Ka)\times(Ix1-Ia1)/(Ib1-Ia1) \quad \text{(Expression 5)}$$

In this case, the correction quantity is a change of the tilt and is considered to be a shift due to a decrease in interference fringe peak intensity or contrast based on interference with the resist or an underlying film. Accordingly, the correction quantity can be expressed in a proportional expression in this way. In the second embodiment, deflection of the mold is corrected on the basis of the intensities of Newton's rings. Here, only the first peak intensity is used, but an average of the first peak intensity and another peak intensity may be used.

Third Embodiment

Figure 16:
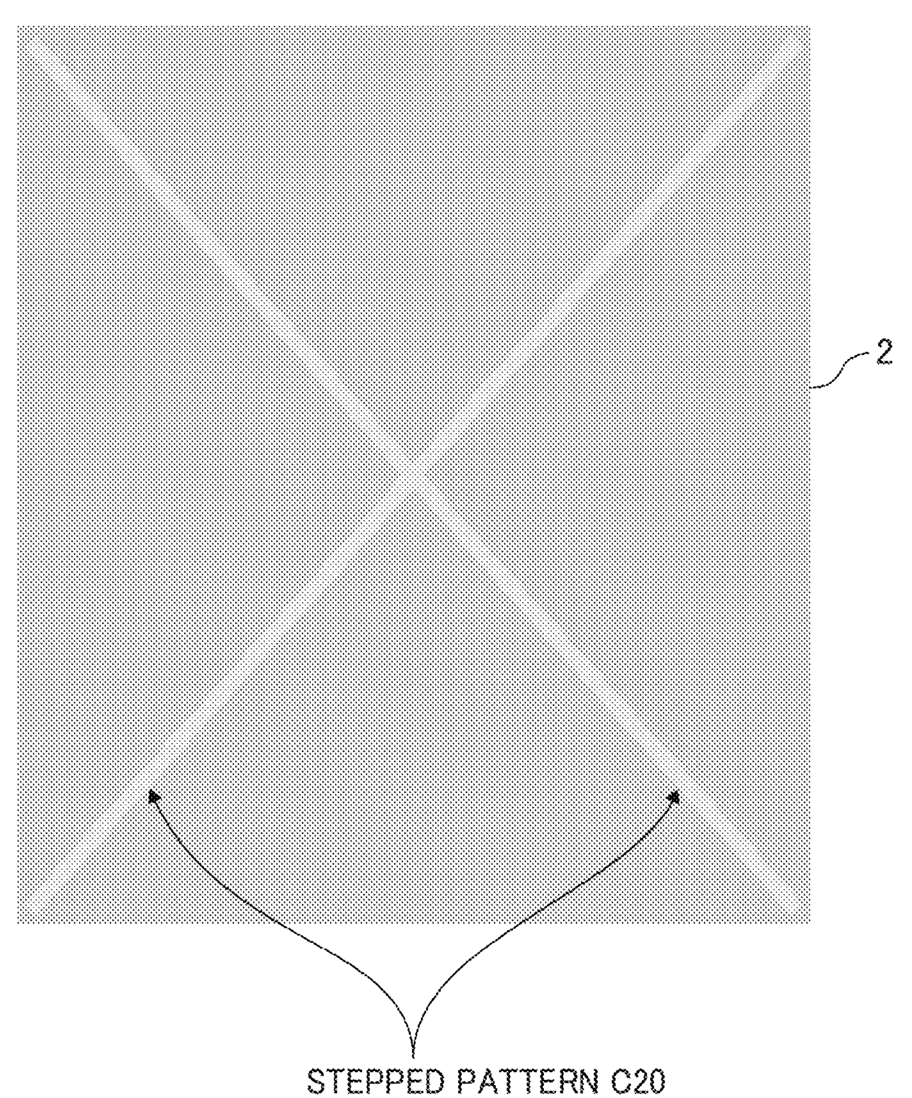
FIG. 16 is a conceptual diagram illustrating a stepped pattern in a mold mesa surface or in a substrate shot according to a third embodiment.

An interference fringe measuring method using a stepped pattern will be described below. FIG. 16 is a conceptual diagram of a stepped pattern in a mold mesa surface or in a wafer shot according to a third embodiment.

A stepped pattern C20 extends in a diagonal direction of the mesa region 2, a width thereof is about several hundreds μm, and a depth thereof is less by several times to several tens of times than the optical distance λ/4. That is, the stepped pattern includes a stepped portion extending in a direction in which the contact boundary moves by pressing and includes a stepped portion lower than the optical distance λ/4.

The pattern width is determined on the basis of a relationship with interference fringe image processing. On the basis of a pixel size of a detector and a projected mesa enlargement/reduction rate, it is preferable that the pattern width be larger than at least a pixel resolution (a pixel size) when viewed from a projection side and be a size including one or more pixels. That is, regarding the width of the stepped pattern, the width of a projected image is preferably several to several tens of times an image pixel.

Figure 17:
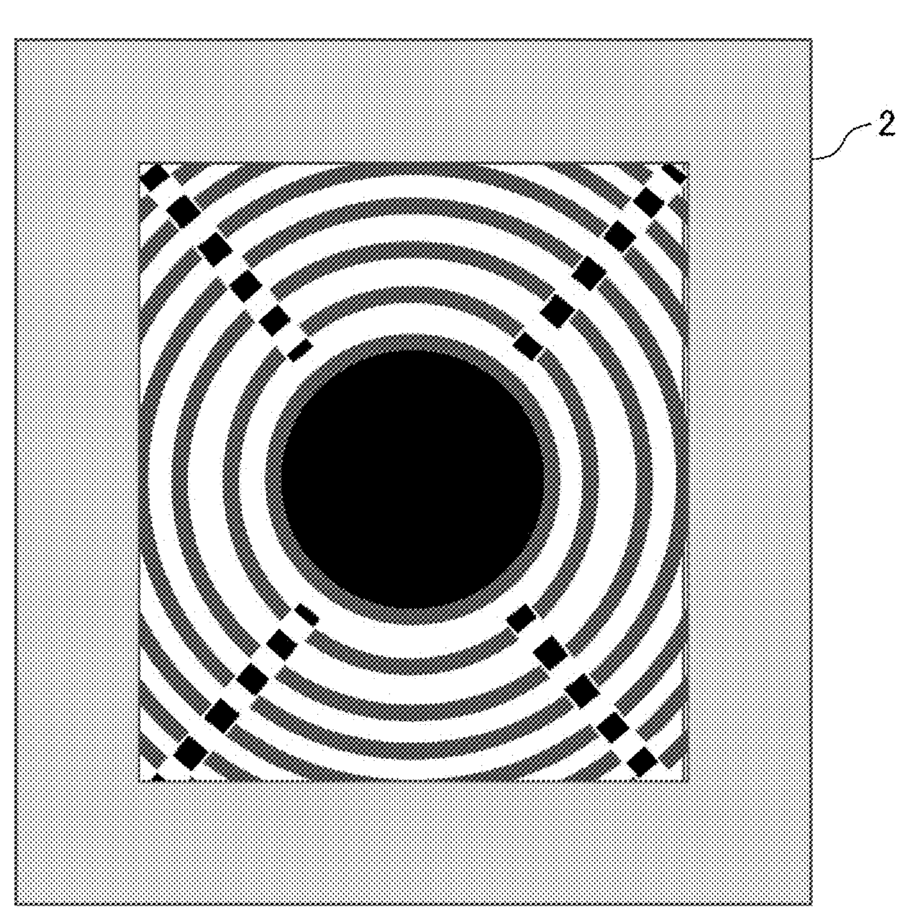
FIG. 17 is a diagram illustrating an example of Newton's rings when imprinting is performed with a stepped pattern provided on a mesa side, a substrate side, or both thereof.

FIG. 17 is a diagram illustrating an example of Newton's rings when imprinting is performed with a stepped pattern provided on a mesa side, a wafer side, or both sides. By providing the stepped pattern illustrated in FIG. 17, different fringes with the width of the stepped pattern in addition to normal Newton's rings can be obtained in the diagonal direction of the mesa.

The principle will be described below with reference to FIG. 18. FIG. 18 is a conceptual diagram illustrating parallel arrangement of the example illustrated in FIG. 10 and the example illustrated in FIG. 11, with the right part illustrating a case in which patterns with a level difference m and a level difference W are provided in the mold and the substrate.

In the right example of FIGS. 18, P1, P2, and P3 are detected in the mesa region instead of a pattern stepped portion and R1_b_, R2_b_, and R3_b_ are acquired as described above. In the pattern stepped portion, different interference fringes at the same radial distance by a stepped pattern distance (m+w) are formed as illustrated in FIG. 17.

When P1 and P2 of the pattern stepped portion are plotted as C1_b_ and C2_b_ as illustrated in FIG. 18, C1_b_ is located on a curve S between R1_b_ and R2_b_, and C2_b_ is located on the curve S between R2_b_ and R3_b_.

When a height of C1_b_ from the substrate is λ/4 and is expressed by a height with the RLT height as an origin, the height H of R1_b_ is expressed as H=λ/4−RLT, the height of C1_b_ is expressed as λ/4−RLT+(m+w), that is, H+(m+w). The height of C2_b_ is expressed as H+(m+w)+λ/4, and the plurality of points are plotted as illustrated in the right part of FIG. 18.

A tilt b' can be calculated through collinear approximation of two or more points of the plurality of points. By using the same method, a mold tilt can be measured on the basis of a plurality of points through one time of imprinting from the stepped pattern C20 illustrated in FIGS. 19 and 20 in the same way.

Figure 19:
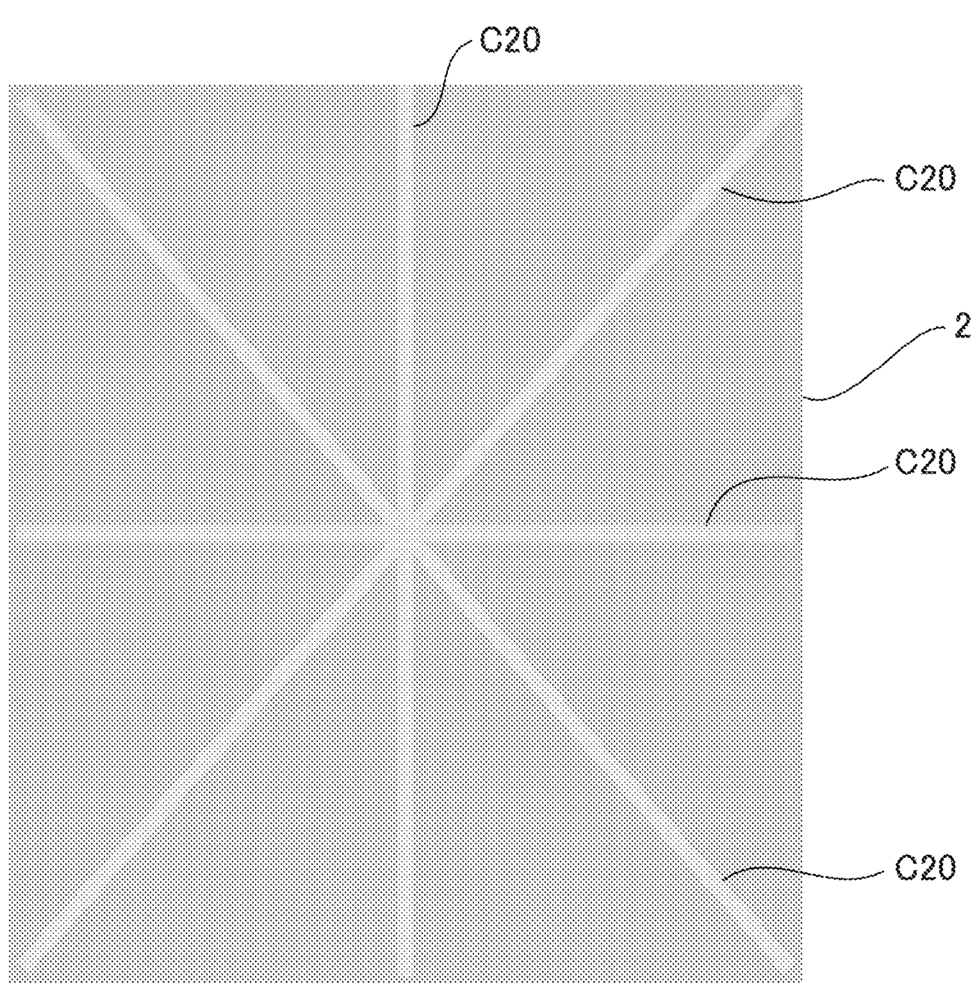
FIG. 19 is a conceptual diagram illustrating another example of the stepped pattern in the mold mesa surface or in the substrate shot.
Figure 20:
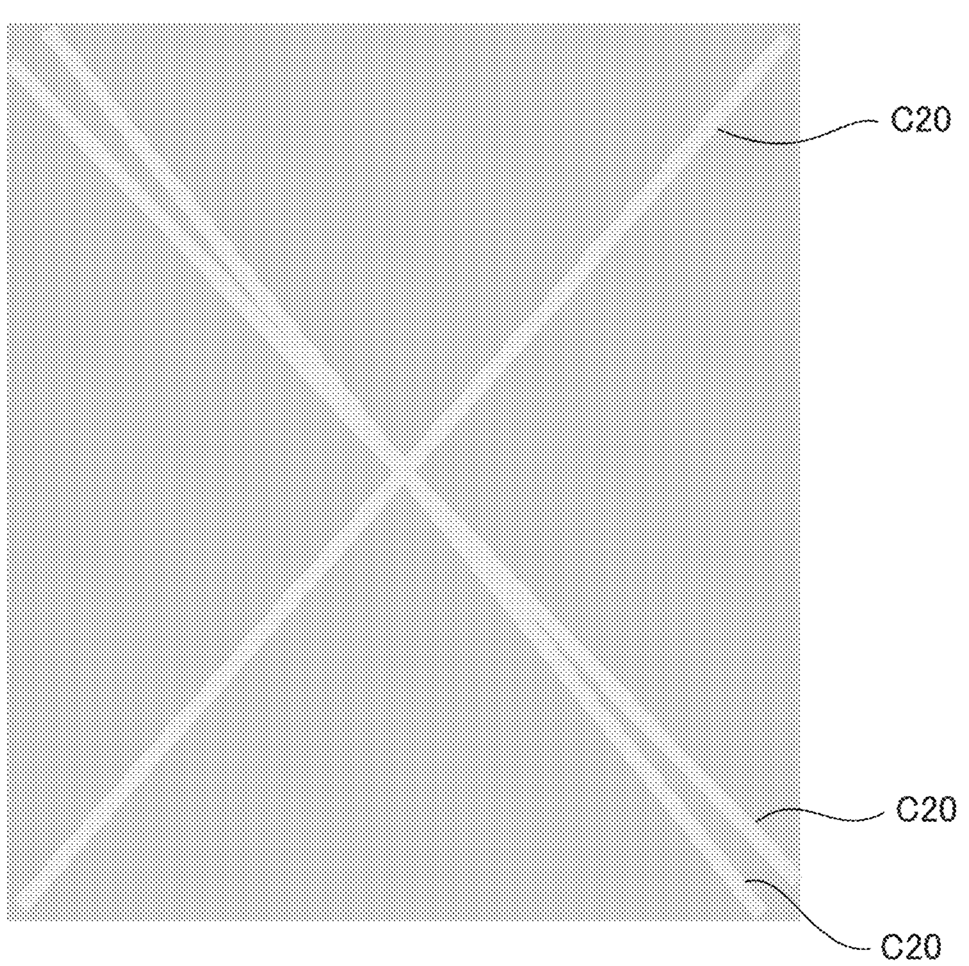
FIG. 20 is a conceptual diagram illustrating another example of the stepped pattern in the mold mesa surface or in the substrate shot.

FIG. 19 is a conceptual diagram illustrating another example of a stepped pattern in a mold mesa surface or in a wafer shot. FIG. 20 is a conceptual diagram illustrating another example of a stepped pattern in a mold mesa surface or in a wafer shot.

In FIG. 19, information in different radial directions is acquired. In FIG. 20, a position difference due to stepped pattern arrangement can be corrected on the basis of a difference between a region interposed between two stepped patterns and one stepped pattern region. Depending on a stepped pattern type, a level difference may be changed according to the direction. Accordingly, a large amount of mold height information can be obtained at a time.

In the third embodiment, deflection of a mold is measured by performing pressing using a mold or a substrate with a pattern stepped portion of a predetermined height. Accordingly, it is possible to deflection information of the mold with high accuracy.

In the third embodiment, a measurement method with a pattern stepped portion provided in a mold or a substrate has been described. With the same idea, by removing a resist from a partial region in advance or not applying a resist thereto, a resist stepped portion may be formed in the region from which a resist is removed in advance or to which a resist is not applied at the time of subsequent imprinting. That is, the stepped pattern includes a stepped portion formed in the resist in advance.

By aligning the region to a detection direction, the RLT is known in association with the height of Newton's rings, and thus the peak positions of the Newton's rings can be measured as a height of $\lambda/4-$RLT.

Figure 21:
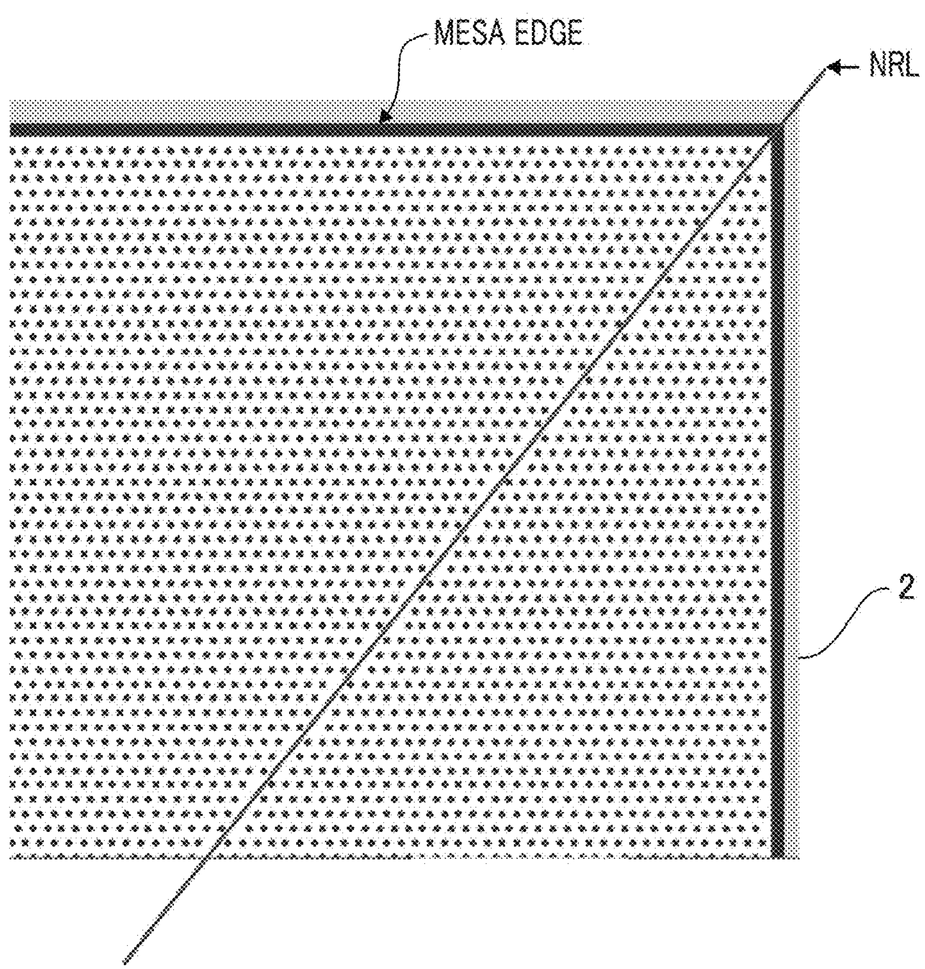
FIG. 21 is a diagram illustrating an example in which a resist has been partially deleted in advance.

FIG. 21 is a diagram illustrating an example in which a resist has been partially removed in advance. In FIG. 21, drop arrangement in the vicinity of a mesa edge is illustrated, and drops have been removed in a constant width along a line NRL connecting diagonal corners of the mesa. Accordingly, it is possible to perform measurement of Newton's rings at the diagonal corners without being affected by an error of the optical distance due to liquid droplets or the resist described above in the second embodiment.

Fourth Embodiment

The method of measuring mold deflection with high accuracy in measuring Newton's rings has been described above according to the first to third embodiments.

In a fourth embodiment, a method of calibrating a measurement error of Newton's rings will be mentioned. In the fourth embodiment, although different from Newton ring images during imprinting, a method of aerially measuring a mold in a stationary state is used.

Figure 22:
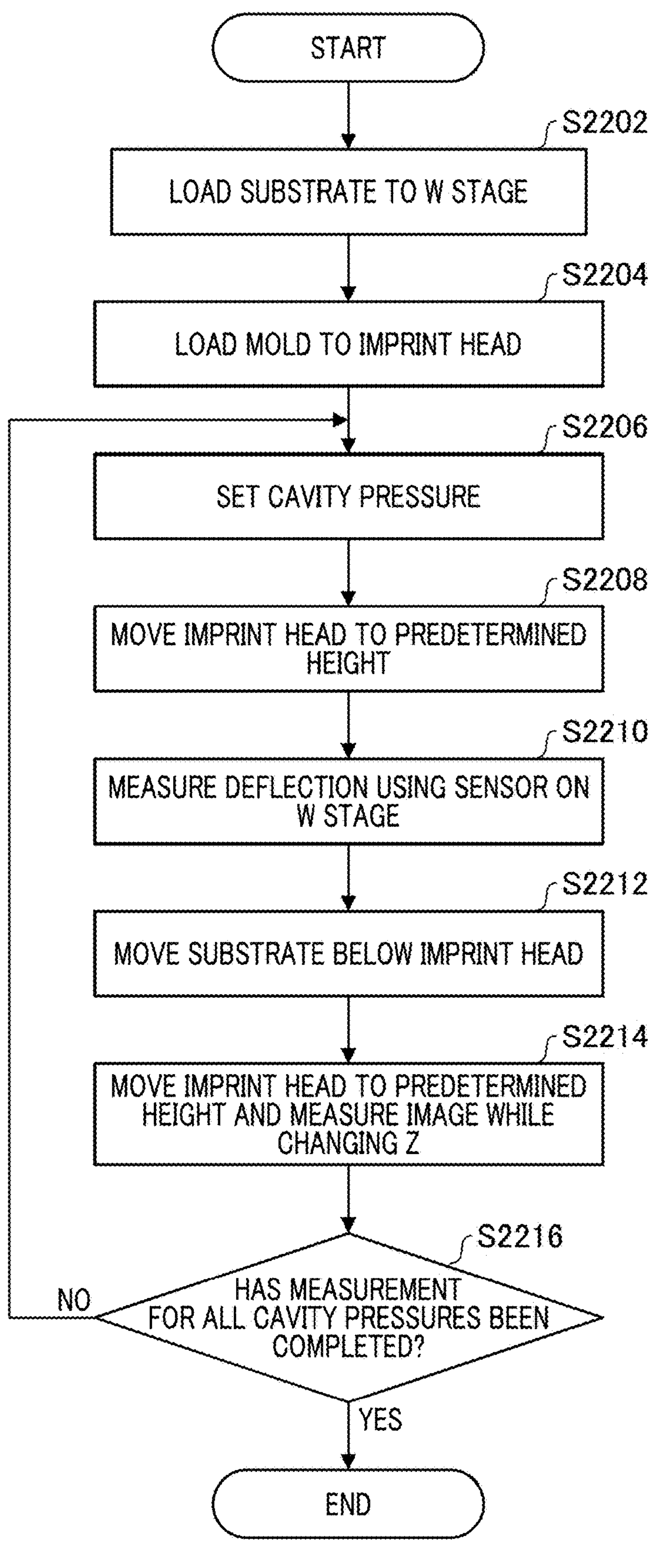
FIG. 22 is a flowchart illustrating a process example of a measurement error processing method according to a fourth embodiment.

FIG. 22 is a flowchart illustrating a process flow of a measurement error calibration method according to the fourth embodiment. The operations of the steps in the flowchart of FIG. 22 are sequentially performed by causing a CPU or the like which is a computer in the control unit 18 to execute a computer program stored in a memory.

In Step S2202, a substrate is loaded onto the substrate stage 3. The height of the substrate at that time is managed by the second measurement unit 16. In Step S2204, a mold is loaded to the imprint head. In Step S2206, a preset pressure value is applied to a cavity of the mold.

In Step S2208, the imprint head is moved to a predetermined height at which measurement is performed by the first measurement unit 15. In Step S2210, deflection of the mold is measured by the first measurement unit 15 while moving the substrate stage 3.

In Step S2212, the substrate is moved below the imprint head by the substrate stage 3 in order to form Newton's rings based on the loaded substrate and the mold deflection In Step S2214, since the height of the substrate and the mold deflection are known through the measurement, the imprint head is moved to a predetermined height, a stationary image of Newton's rings is acquired while changing the Z-axis position therefrom, image measurement is performed, and the measurement result is stored.

In Step S2216, it is determined whether measurement has been completed at all of a plurality of different cavity pressures, and the aforementioned series of processes is repeated from Step S2206 when the determination result is NO. When the determination result of Step S2216 is YES, the measurement flow of FIG. 22 ends. It is possible to calibrate absolute measured values of sensors and Newton's rings through the measurement flow illustrated in FIG. 22.

In addition, in order to calibrate measured values of Newton's rings due to substrate differences, a substrate serving as a reference (a reference substrate) is prepared, and a curvature of a mold is measured from an image acquired through pressing (imprinting) in a stopped state or at a predetermined speed or lower which can be considered to be the same as the stopped state. Measurement on a substrate with an error to be corrected may be performed at the same imprinting speed, and correction of the error may be performed. A measurement error due to substrate differences can be removed through this calibration method.

Fifth Embodiment

In the first to fourth embodiments, the method of acquiring an image of Newton's rings during imprinting and measuring a curvature of a mold with high accuracy has been described.

In a fifth embodiment, device calibration can be performed with high accuracy by changing an image acquisition rate to increase a sampling rate. That is, an image of Newton's rings is acquired at two or more different rates through a plurality of times of pressing, and deflection of a mold is analyzed.

In general, a method of decreasing a resolution such as decreasing an amount of data to be acquired by thinning out pixels is performed to increase the image acquisition rate, but measurement accuracy is decreased in such a case. Accordingly, an image acquisition start timing changes every imprinting. That is, a plurality of imprint images with different start timings may be acquired, for example, by delaying the image acquisition start timing, and the frame rate may be increased by synthesizing the plurality of imprint images.

Figure 23:
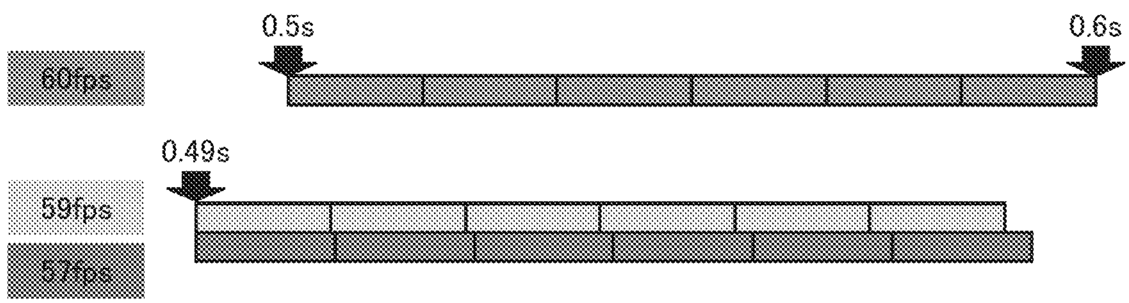
FIG. 23 is a diagram illustrating an example in which images are acquired at different frame rates set at the times of imprinting and imprinting images at the different frame rates are synthesized.

FIG. 23 is a diagram illustrating an example in which images are acquired at different frame rates every imprinting and imprinting images at the different frame rates are synthesized.

It is assumed that an impression time of imprinting (dynamic spread) is 0.6 s (seconds) and an image acquisition frame rate is 60 fps (frames per second), that is, an image acquisition interval is ($1/60$) s. In this case, when an image acquisition start time comes at 0.5 s, the image acquisition start time at 59 fps or 57 fps comes at 0.49 s as illustrated in FIG. 23, and there is a difference of 0.01 s=$1/100$ s therebetween.

That is about a half of a pitch ($1/60$) of 60 fps, and image acquisition is performed with deviation of about a half pitch in the time of 0.5 s to 0.6 s. The same is true of the time of 0.4 s to 0.5 s on the opposite side.

In order to increase the frame rate in a specific time domain in this way, the frame rate may be increased without decreasing the resolution by acquiring an imprint image at mixed timings of different frame rates and synthesizing a plurality of imprint images as described above.

It is possible to measure deflection of a mold with high accuracy using the measurement method described above in the first to fifth embodiments. Accordingly, it is possible to adjust the operation of the shaping device such as the imprint device such that a cavity pressure profile in an actual imprinting operation, a speed profile with which the mold is pressed, or the like is optimized based on the measured deflection characteristics of the mold.

Accordingly, it is possible to curb occurrence of unfilled defects. The deflection characteristics of the mold include characteristics such as a change in shape or curvature of the mold based on the cavity pressure of the mold or the pressing speed and a rate of change thereof.

Based on the deflection characteristics of the mold measured by the measurement method, it is possible to calibrate a simulator for simulating a cavity pressure profile in an actual imprinting operation, a speed profile with which the mold is pressed, or the like.

While the present invention has been described with reference to exemplary embodiments, it is to be understood that the invention is not limited to the disclosed exemplary embodiments. The scope of the following claims is to be accorded the broadest interpretation to encompass all such modifications and equivalent structures and functions.

In addition, as a part or the whole of the control according to the embodiments, a computer program realizing the function of the embodiments described above may be supplied to the measurement device or the like through a network or various storage media. Then, a computer (or a CPU, an MPU, or the like) of the measurement device or the like may be configured to read and execute the program. In such a case, the program and the storage medium storing the program configure the present invention.

The present invention may be realized, for example, using at least one processor or circuit configured to perform the function of the embodiments explained above. The function may be processed in a distributed manner using a plurality of processors.

This application claims the benefit of Japanese Patent Application No. 2023-016898, filed on Feb. 7, 2023, which is hereby incorporated by reference herein in its entirety.

What is claimed is:

1. A measurement method of measuring deflection of a mold by measuring Newton's rings obtained by pressing the mold on a substrate with a resist interposed therebetween and irradiating the substrate with light via the mold, the measurement method comprising:

performing the pressing through the resist having a height less than an optical distance λ/4, λ being a wavelength of the light;

measuring peak positions of the Newton's rings in a contact boundary portion between the mold and the substrate in a region in which a gap between the mold and the substrate is less than the optical distance λ/4; and calculating the deflection of the mold based on the peak positions.

2. The measurement method according to claim 1, wherein the deflection of the mold is corrected based on intensities of the Newton's rings.

3. The measurement method according to claim 1, wherein the pressing is performed under conditions of the resist having a plurality of different heights less than the optical distance λ/4, and the deflection of the mold is measured from the peak positions of the Newton's rings.

4. The measurement method according to claim 1, wherein the deflection of the mold is measured by performing the pressing using the mold or the substrate having a stepped pattern with a predetermined height.

5. The measurement method according to claim 4, wherein the stepped pattern includes a stepped portion extending in a direction in which the contact boundary moves with the pressing.

6. The measurement method according to claim 4, wherein the stepped pattern includes a stepped portion which is lower than the optical distance λ/4.

7. The measurement method according to claim 4, wherein the stepped pattern includes a stepped portion which has been formed in the resist in advance.

8. The measurement method according to claim 4, wherein a width of the stepped pattern is set such that a width of a projected image is several to several tens of times an image pixel size.

9. The measurement method according to claim 1, wherein calibration of a measured value of the Newton's rings due to substrate differences is performed by the pressing in a stationary state or at a predetermined speed or lower.

10. The measurement method according to claim 1, wherein an image of the Newton's rings is acquired at two or more different rates through a plurality of times of pressing and the deflection of the mold is analyzed.

11. An apparatus configured to perform an operation of pressing the mold onto the substrate with the resist interposed therebetween, wherein the apparatus presses the mold onto the substrate with the resist interposed therebetween based on deflection characteristics of the mold measured by the measurement method according to claim 1.

12. A simulator that simulates an operation of pressing the mold onto the substrate with the resist interposed therebetween based on deflection characteristics of the mold measured by the measurement method according to claim 1.

13. A measurement device that measures deflection of a mold by measuring Newton's rings obtained by pressing the mold on a substrate with a resist interposed therebetween and irradiating the substrate with light via the mold, the measurement device comprising:

an imprint head configured to perform the pressing through the resist having a height less than an optical distance λ/4, λ being a wavelength of the light;

at least one processor or circuit configured to:

measure peak positions of the Newton's rings in a contact boundary portion between the mold and the substrate in a region in which a gap between the mold and the substrate is less than the optical distance λ/4; and calculate the deflection of the mold based on the peak positions.

14. A non-transitory computer-readable storage medium configured to store a computer program comprising instructions for executing following processes:

in order to measure deflection of a mold by measuring Newton's rings obtained by pressing the mold on a substrate with a resist interposed therebetween and irradiating the substrate with light via the mold, performing the pressing through the resist having a height less than an optical distance λ/4, λ being a wavelength of the light;

measuring peak positions of the Newton's rings in a contact boundary portion between the mold and the substrate in a region in which a gap between the mold and the substrate is less than the optical distance λ/4; and calculating the deflection of the mold based on the peak positions.

* * * * *